US006725418B2

(12) United States Patent
Sawaguchi et al.

(10) Patent No.: US 6,725,418 B2
(45) Date of Patent: Apr. 20, 2004

(54) DECODING CIRCUIT USING PATH SEQUENCE INCLUDING FEED-BACK TYPE PATH SEQUENCE STORING BLOCKS

(75) Inventors: Hideki Sawaguchi, Kodaira (JP); Akihiko Hirano, Odawara (JP); Seiichi Mita, Kanagawa-ken (JP); Terumi Takashi, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 120 days.

(21) Appl. No.: 09/994,062

(22) Filed: Nov. 27, 2001

(65) Prior Publication Data

US 2002/0040462 A1 Apr. 4, 2002

Related U.S. Application Data

(63) Continuation of application No. 09/093,931, filed on Jun. 9, 1998, now Pat. No. 6,334,201.

(30) Foreign Application Priority Data

Jun. 12, 1997 (JP) .............................. 9-154717

(51) Int. Cl.[7] .......................................... H03M 13/41
(52) U.S. Cl. ..................................... 714/795
(58) Field of Search ........................ 714/795

(56) References Cited

U.S. PATENT DOCUMENTS

| | | | | |
|---|---|---|---|---|
| 5,257,263 A | * | 10/1993 | Bazet et al. | 714/795 |
| 5,327,441 A | | 7/1994 | Kawazoe et al. | 371/43 |
| 5,446,746 A | * | 8/1995 | Park | 714/795 |
| 5,719,843 A | * | 2/1998 | Nakajima et al. | 369/59.22 |
| 5,729,517 A | * | 3/1998 | Fujiwara et al. | 369/59.22 |
| 5,781,590 A | * | 7/1998 | Shiokawa et al. | 375/341 |
| 5,796,756 A | * | 8/1998 | Choi et al. | 714/795 |
| 5,844,945 A | * | 12/1998 | Nam et al. | 375/341 |
| 5,931,966 A | * | 8/1999 | Carley | 714/795 |
| 6,041,433 A | * | 3/2000 | Kamada | 714/795 |
| 6,334,201 B1 | * | 12/2001 | Sawaguchi et al. | 714/795 |

FOREIGN PATENT DOCUMENTS

| JP | 2-230822 | 9/1990 |
|---|---|---|
| JP | 06-152438 | 5/1994 |
| JP | 09-232972 | 2/1996 |

OTHER PUBLICATIONS

Millman and Grabel, Microelectronics, Second Edition, McGraw–Hill, 1987, pp. 318–324.*
Kawazoe et al, "Universal–coding–rate Scarce–state–transition Viterbi Decoder", ICC '92, Jun. 1992, pp. 1538–1587.
Kawazoe et al, "Ultra–high–speed and Universal–coding–rate Viterbi Decoder VLSIC–SNUFEC VLSI", ICC '93, May 1993, pp. 1434–1438.

(List continued on next page.)

Primary Examiner—Stephen M. Baker
(74) Attorney, Agent, or Firm—Mattingly, Stanger & Malur, P.C.

(57) ABSTRACT

A maximum likelihood decoding circuit is arranged to reduce the power consumption through the effect of the Viterbi algorithm. A plurality of storing elements 61a to 61h located vertically in a column and for storing each state survivor path information at the same time point are treated as storing element blocks 60(1) to 60(D) in a manner to correspond to the combination (state) of intra-code interferences. The outputs from the storing elements 61a to 61h are again applied into the inputs of the corresponding storing elements contained in the same storing element block through the path history selecting circuits 62a to 62h. Each of the storing element block 60(1) to 60(D) is periodically started on the input timing of a receiving signal at each processing time point by starting points (pointers) 63(1) to 63(D) outputted from a starting signal (pointer) generating circuit 68. A storing element block output circuit 64 and storing element block output terminals 65(1) to 65(D) are provided in each of the storing element blocks 60(1) to 60(D) so that a path memory circuit output 67 may be outputted through an OR circuit 66.

2 Claims, 16 Drawing Sheets

OTHER PUBLICATIONS

Yamazato et al, "Reduced Path Viterbi Decoder with Inverse Circuit of the Encoder", 1993 IEEE Pacific Rim Conf., May 1993, pp. 569–572.

Kubota et al, "Novel Viterbi Decoder VLSI Implementation and its Performance", IEEE Trans. on Communications, vol. 41, No. 8, Aug. 1993, pp. 1170–1178.

Seki et al, "Very low power consumption Viterbi decoder LSIC employing the SST (scare state transistion) scheme for multimedia mobile communications", Electronics Letters, vol. 30, No. 8, Apr. 14, 1994, pp. 637–639.

Proceedings of the IEEE, vol. 61, No. 3, Mar. 1973, "The Viterbi Algorithm", G. Forney, pp. 268–278.

IEEE Transactions on Communcations, vol. COM–22, No. 5, May 1974, "Adaptive Maximum–Likelihood Receiver for Carrier–Modulated Data–Transmission Systems", G. Ungerboeck, pp. 624–636.

IEEE Signal Processing Magazine, Sep. 1995, "Implementing the Viterbi Algorithm", H. Lou, pp. 42–52.

IEEE Communications Magazine, May 1991, "High–Speed Parallel Viterbi Decoding: Algorithm and VLSI–Architecture", G. Fettweis et al, pp. 46–55.

* cited by examiner

TIME UNIT n

TIME UNIT n

DECODING CIRCUIT USING PATH SEQUENCE INCLUDING FEED-BACK TYPE PATH SEQUENCE STORING BLOCKS

This is a continuation application of U.S. Ser. No. 09/093,931 filed Jun. 9, 1998, U.S. Pat. No. 6,334,201.

BACKGROUND OF THE INVENTION

The present invention relates to a receiving device or a reproducing device provided in an information transmitting and communicating apparatus or an information storing and reproducing apparatus and more particularly to a maximum likelihood decoding device or a method of implementing a general composition of a maximum likelihood decoding circuit widely used in various information processing and signal processing devices.

In order to improve low-quality transmission or reliability of data reproduction from a recording and reproducing signal in a fast information communications system or a high-density information recording and reproducing system, there has been widely used an error correction demodulation technique based on a data decoding technique and a convolutional encoding technique that utilizes the MLSD (Maximum Likelihood Sequence Detection).

This maximum likelihood sequence detection is a technique of suppressing a probability of causing an error in a decoded code sequence to a minimum by estimating the decoded code sequence in time series based on the storage characteristic or the correlation of the decoded data. In this technique, when a received signal sequence $\{Y(n)\}$ (n denotes an integer for indicating a discrete signal occurrence sequence and time) is given into the decoding input, the maximum likelihood sequence of receiving $\{Y(n)\}$ (the maximum likelihood sequence) is selected from all possible transmission information (code) sequences $\{X(n)\}$ and then the maximum likelihood sequence is outputted as the decoded information (code) sequence $\{Z(n)\}$. In other words, given all possible sequences of a certain receiving signal sequence $\{Y(n)\}$, on the assumption of a certain transmitting sequence $\{X(n)\}$, the transmitting sequence $\{X(n)\}$ is selected so that the a-posteriori probability P ($\{Y(n)\}/\{X(n)\}$) before and after the receiving signal sequence $\{Y(n)\}$ is received is made maximum, for estimating the maximum likelihood sequence of the decoded sequence $\{Z(n)\}$. At this time, the transmitting sequence $\{X(n)\}$ is estimated not independently but on the context. This kind of maximum likelihood sequence detection provides the most excellent decoding error probability in the decoding operation as keeping a correct decision probability P ($\{X(n)\}$ & $\{Z(n)\}$) (the probability of coinciding the transmitting sequence $\{X(n)\}$ with the decoded sequence $\{Z(n)\}$) in the condition of transmitting all possible transmission sequences $\{X(n)\}$ at equal probabilities, in other words, in the condition of giving no information about the transmitting probability of each transmitting sequence $\{X(n)\}$.

This maximum likelihood sequence detection is efficiently realized by using a dynamically programing Viterbi algorithm. The papers about the maximum likelihood sequence detection and the Viterbi algorithm are, for example, G. D. Forney, "The Viterbi Algorithm", Proceedings of the IEEE, vol. 61, No.3, March 1973, pp.268 to 278 and G. Ungerbock, "Adaptive Maximum Likelihood Receiver for Carrier-Modulated Data Transmission Systems", IEEE Transactions on Communications, vol. COM-22, No.5, May 1974, pp.624 to 638. These papers discuss the receiver apparatus arranged to use the maximum likelihood sequence detection or its partial basic arrangement. Further, the actual implementation of the Viterbi Algorithm is discussed in detail in Hui-Ling Lou, "Implementing the Viterbi Algorithm", IEEE Signal Processing Magazine, Sept. 1995, pp.42–52 and G. Fettweis and H. Meyr, "High-speed Parallel Viterbi Decoding: Algorithm and VLSI-architecture", IEEE Communications Magazine, May 1991, pp. 46 to 55.

SUMMARY OF THE INVENTION

The maximum likelihood sequence detection arranged to use this kind of Viterbi algorithm is executed to select the sequence having the maximum receiving likelihood (the maximum likelihood sequence) based on the context of the receiving signal sequences and output it as the most probable decoded information (code) sequence. This sequence corresponds to the decoded result. Hence, this detection needs to prepare a survivor path sequence history storing circuit (path memory) for storing the candidate sequences (survivor path sequences) of the maximum likelihood sequences to be progressively narrowed, sequentially updating the content based on the comparative operational result of the likelihood, and deciding the maximum likelihood decoded result. From a viewpoint of the principle of the Viterbi algorithm, this path sequence history storing circuit is required to store information about a long survivor path sequence history, which should be long enough to secure the decoding reliability against the noises in the receiving signal sequence. For implementing the Viterbi algorithm, it is necessary to prepare the survivor path sequence storing circuit (path memory) having a massive volume for corresponding to the required decoding reliability.

For example, a small-sized information processing instrument representatively such as a portable information terminal is earnestly required to reduce the power consumption for the purpose of suppressing the consumption of a cell and extending the operating time. In the case of applying the maximum likelihood decoding technique to a signal processing system included in this type of information processing instrument, the reduction of the electric power consumed in the path memory is one of the significant technical issues.

It is an object of the present invention to reduce the electric power consumed in a relatively large-scale survivor path sequence storing circuit (path memory) included in the maximum likelihood decoding circuit or the maximum likelihood decoding device.

It is an object of the present invention to provide a decoding circuit to be mounted into a relatively small-sized information processing instrument requested to lower the power consumption.

It is still another object of the present invention to provide a decoding circuit which enables to control and operate the instrument to be built into the system from various points of view.

It is a further object of the present invention to provide a decoding circuit which may improve flexibility in design, integrity in mounting, and yields in packing the decoding circuit to the semiconductor integrated circuit.

It is a still further object of the present invention to provide an information processing apparatus which is arranged to reduce the power consumption of the relatively large-scale survivor path sequence storing circuit (path memory) included in the mounted maximum likelihood decoding circuit or maximum likelihood decoding device, for realizing the reduction of the power consumption of the overall apparatus.

It is another object of the present invention to provide an information processing apparatus which is arranged to consume a low electric power and easily implement the high reliability based on the maximum likelihood decoding.

It is another object of the present invention to provide an information processing apparatus which may be controlled and prompted from various points of view and based on the information obtained from the mounted decoding circuit.

It is another object of the present invention to provide an information processing apparatus which is arranged to improve flexibility in design and integrity in packaging when packaging the mounted decoding circuit for doing the maximum likelihood decoding operation to a semiconductor integrated circuit.

The present invention utilizes convergence of the survivor path sequence information in the Viterbi algorithm. Of plural pieces of survivor path sequence information stored in the survivor path sequence storing circuit, the survivor path sequence information pieces corresponding to the convergence-completed portion are all identical with each other. The stored content is not varied from when the convergence is completed to when the information is outputted as the decoded result. In the actual decoding process, the phenomenon that the survivor path information pieces are not still convergent in the almost length of the prepared survivor path sequence storing circuit depends on the expected decoding reliability and hence is brought about so rarely. Normally, the survivor path sequence information is quickly and concentratively converted at a quite early stage of the length of the prepared survivor path sequence storing circuit. The present invention uses the property of the convergence of the survivor path sequence information for lowering a frequency of updating the stored content of the storing element of the survivor path sequence storing circuit and a utilization rate of the circuit, thereby reducing the power consumption. For this purpose, the present invention provides means for composing the survivor path sequence storing circuit for constantly holding plural candidates of the survivor path sequence information for each receiving signal sequence time in the same storage element block composed of plural storage elements and recursively updating the survivor path sequence information among the storage elements, for the purpose of concretely implementing the reduction of the circuit utilization rate. Further, for enhancing the reducing effect of the power consumption, the present invention provides means for predicting the storage element block in which the convergence of the survivor path sequence information is completed or the storage elements for holding the survivor path sequence information that is not necessary later than the present time and stopping a synchronous clock signal for starting the update operation of the predicted storage elements.

DETAILED DESCRIPTION OF THE PREFERRED EMBODIMENTS

Hereafter, the present invention will be described in detail along the preferred embodiments with reference to the appended drawings.

In the following description, for making the description more easily understood, at first, the general arrangement of a survivor path sequence storing circuit for realizing the maximum likelihood decoding process based on the Viterbi algorithm will be described with a help of the arrangement considered by the inventors of the present application. Then, the preferred embodiments of the invention will be described in the form of comparing the arrangement with the embodiments.

Figure 9:
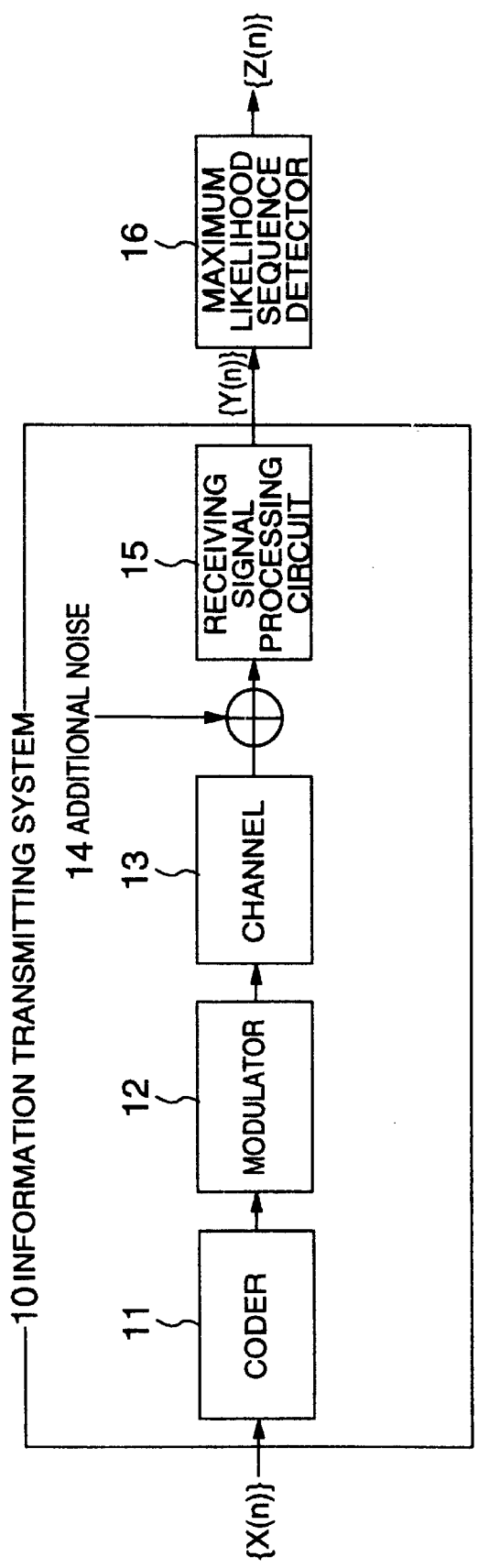
FIG. 9 is a conceptual view showing an example of a flow of an information sequence in a general information transmitting system and a general recording and reproducing system.

FIGS. 9 to 12 are views for schematically describing the maximum likelihood sequence detection based on the Viterbi algorithm. FIG. 9 shows a flow of an information sequence in the information transmission system and a recording and reproducing system. On the transmission (recording) side, a coder 11 operates to add a given constraint condition to the transmitting or recording information (code) sequence $\{X(n)\}$. Then, a modulator 12 operates to convert the sequence into an analog or digital signal information sequence to be transmitted through a channel 13 and then output it to the channel 13. The channel 13 is an information transmitting medium composed of a transmission or recording medium and a transducer sensor. Particularly in the information recording and reproducing apparatus, the channel 13 corresponds to a recording and reproducing system containing a recording head, an information recording medium and a reproducing head. In the transmission process, the signal is given an additional noise 14, so that the decoding from the receiving signal $\{Y(n)\}$ into the original information is undefined. On the receiving (reproducing) side, a receiving signal processing circuit 15 performs a given treatment with respect to the signal outputted from the channel 13. After the treatment, the receiving signal sequence $\{Y(n)\}$ is decoded into the decoded information (code) sequence $\{Z(n)\}$ through the effect of the maximum likelihood sequence detector 16, from which sequence $\{Z(n)\}$ the original transmitting or recording information (code) sequence $\{X(n)\}$ is presumed.

A numeral 10 denotes an information transmitting system that corresponds to a pre-processing stage of the maximum likelihood sequence detector 16 from the coder 11 to the receiving signal processing circuit 15. The system 10 may contain various storage elements located therein. For example, the coder 11 may intentionally add redundancy to the transmitting sequence $\{X(n)\}$ by convoluting and mapping the codes to be inputted or outputted to or from the coder 11, those codes sequentially stored in a definite number of storage elements, for the purpose of detecting and correcting a decoding error or adding the constraint condition required for the transmission process to the transmitting codes by using the convolution codes or the trellis codes. Further, in the transmission process from the modulator 12 to the receiving signal processing circuit 15, the storage elements may be located on the channel for intentionally or unintentionally adding the interference between the codes. If these storage elements are located on the information transmitting system 10, each value of the receiving signal sequence $\{Y(n)\}$ does not correspond to each value of the transmitting sequence $\{X(n)\}$ in a one-to-one manner. Each value is defined in correspondence with the state of the storage element that depends on the history of the transmitting sequence $\{X(n)\}$ at each time.

Figure 10:
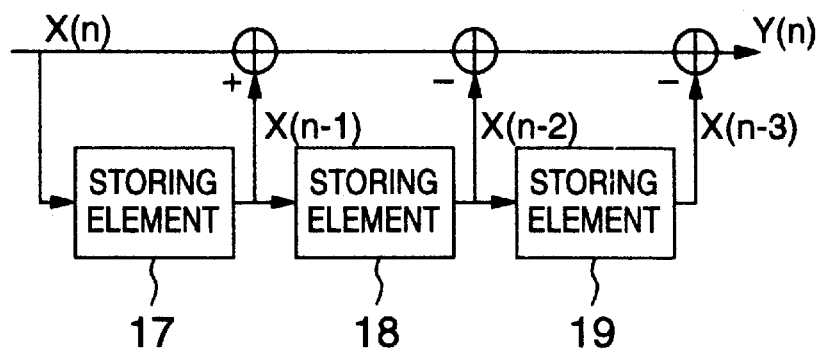
FIG. 10 is a conceptual view showing an example of an EPR 4 channel model.
Figure 11:
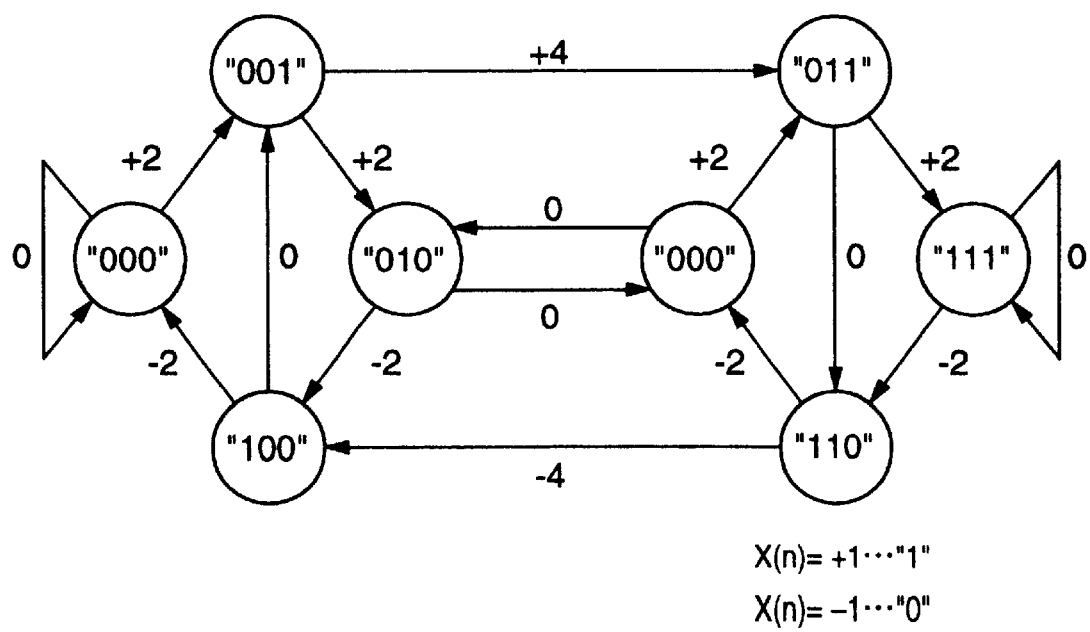
FIG. 11 is a Markov state transition view showing an example of a corresponding relation among the receiving signal sequence, the transmitting sequence, and the state of the storage element on the information transmitting sequence.

FIG. 11 shows a Markov state transition model showing the correspondence relation among the receiving signal sequence $\{Y(n)\}$, the transmitting sequence $\{X(n)\}$ and the state of the storage element. In this example, assuming that three storage elements 17, 18 and 19 as shown in FIG. 10 are on the information transmission system 10, each value of the received signal sequence $\{Y(n)\}$ is defined by the relation of $Y(n) = X(n) + X(n-1) - X(n-2) X(n-3)$ through the effect of the linear convoluting operation with the history of the three bits immediately before the transmitting signal sequence $\{X(n)\}$. The binary code ($X(n)=+1$ or $-1$) is assumed on the transmitting sequence $\{X(n)\}$. The information transmitting system 10 may take totally eight stages depending on the content of the storage elements of three bits. The information transmitting system 10 modeled as described above is called an EPR 4 (Extended Partial Response Class 4), which is often used in an information transmission channel of the magnetic recording and reproducing system. This is discussed in JP-A-7-249998.

The state transition chart shown in FIG. 11 indicates all the transition processes in all the cases, such as how the state of the storage element of the information transmission system 10 is transited or from which of the receiving signal sequence $\{Y(n)\}$ an expected value $\{E(n)\}$ is received. Hence, given any transmitting system $\{X(n)\}$, the sequence is represented by a unique transition path sequence on the state transition chart.

Figure 12:
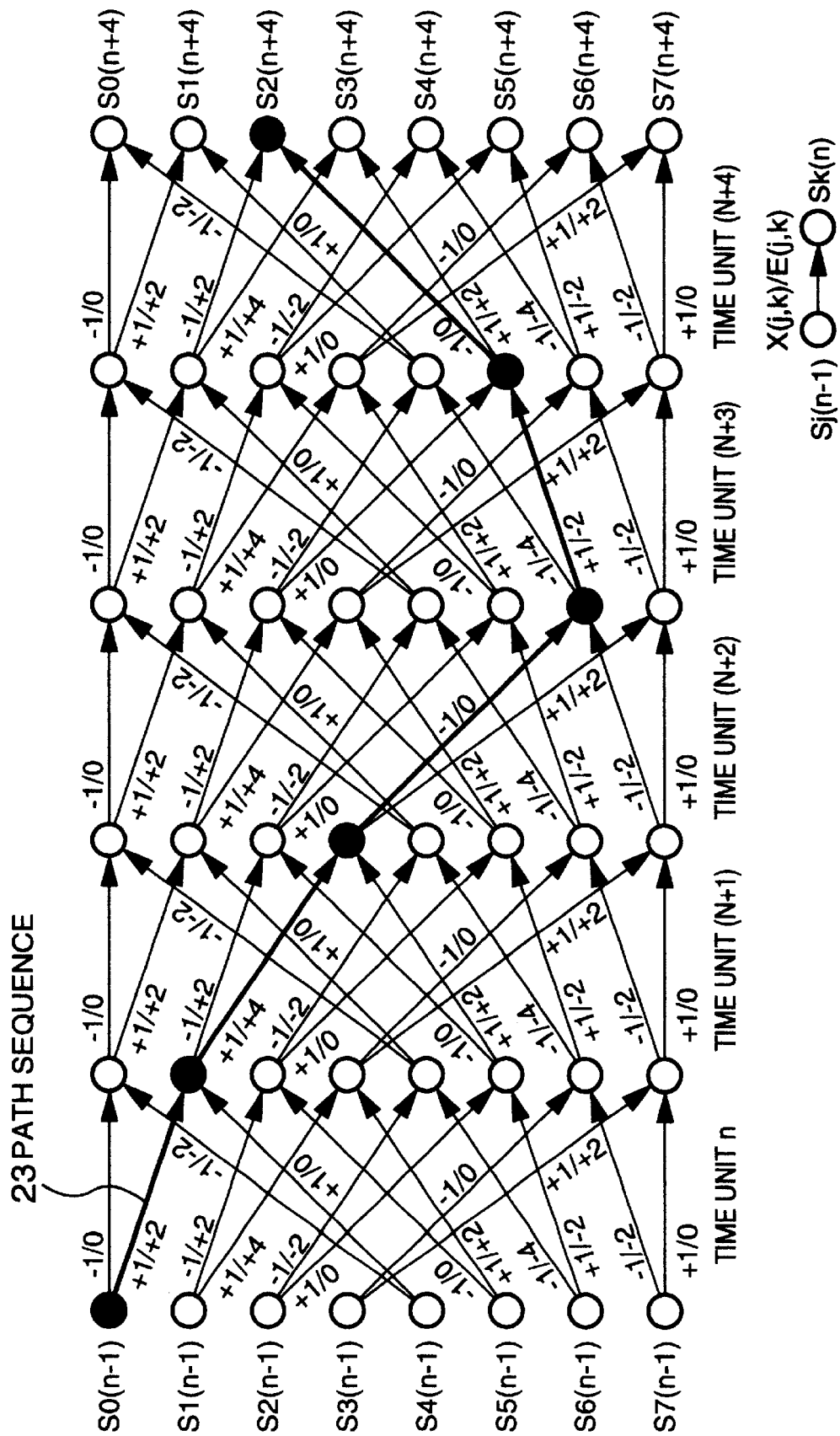
FIG. 12 is a trellis chart showing an example of a time transition of a state transition path sequence of EPR four channels of a binary code transmitting sequence.

FIG. 12 is a trellis (lattice) chart in which the state transition chart of FIG. 11 is expanded along the axis of abscissas and the axis of time, for the purpose of representing a time transition of the state transition path sequence. In FIG. 12, eight states in FIG. 11, "000", "001", "110" "111", correspond to a state number j=0, 1, 2, to 7, which is represented by Sj (that is, S0, S1, S2, to S7). The transition state for each time n is represented by Sj(n) (that is, S0(n), S1(n), S2(n), to S7(n)), which indicates the state defined by the transmitting code at the time n. At each time n, each branch arrow for indicating the transition from the state Sj(n−1) to the state Sk(n) contains a form of X(j, k)/E(j, k) in which X(j, k) denotes the transmitting code for causing the transition from a state Sj to Sk (in other words, the encoded code given when the transition is established) and E(j, k) denotes an expected value of an output signal given in causing the transition. (The time-invariant information transmitting system 10 defines the structure of the state transition and is not varied on a time unit n. X(j, k) and E(j, k) are not varied on a time unit n and are defined merely depending on the state Sj and Sk. If it is time-variant, the following discussion may be easily generalized.)

From FIG. 12 may be represented the correspondence between the code $\{X(n)\}$ transmitted at each time unit n and the state transition path and the received signal expected value $\{E(n)\}$ of the transmitted code.

For example, at the time units n to (n+4), the path sequence 23 by the consecutive five state transition path (branches) represents a five-bit transmitting code sequence $\{+1, +1, -1, +1, -1\}$ and the channel state transition of the information transmitting system 10 of the sequence. The expected value of the receiving signal sequence is represented as $\{+2, +4, 0, -2, 0\}$.

Considering the state transition of the information transmitting system 10, the maximum likelihood estimation done by the maximum likelihood sequence detector 16 is executed to estimate an error between the actually observed receiving signal sequence $\{Y(n)\}$ with the noises convoluted thereon and the expected value $\{E(n)\}$ of the receiving signal on each path of the state transition chart and to uniquely define the transition of the state transition path with the smallest total error of the overall receiving signal sequence {Y(n)}, and output the transmitting code sequence {X(n)} for the defined path as the decoded sequence {Z(n)}. This is for estimating the pattern-matching signal (code) sequence, based on the so-called principle of a least square method.

The Viterbi algorithm provides means for efficiently realizing the pattern matching on the continuous time sequence signal in a definite hardware source (storage element for storing the time sequence signal information) and within a definite processing delay time.

FIGS. 13 to 16 are views for concretely describing the method of the maximum likelihood sequence detection (Viterbi decoding) based on the Viterbi algorithm. Herein, assuming the EPR 4 channel shown in FIG. 10 as the information transmitting system 10, the Viterbi decoding will be schematically described with reference to the state transition chart shown in FIG. 11 and the trellis chart shown in FIG. 12.

Figure 13:
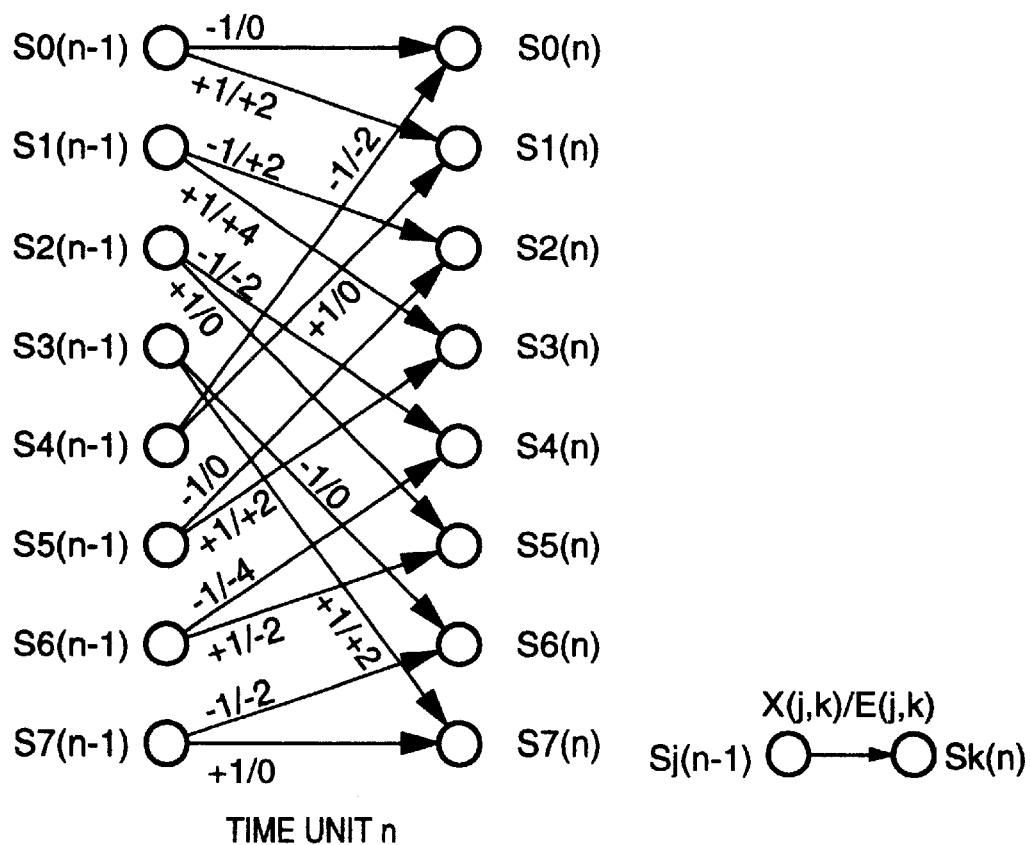
FIG. 13 is an explanatory view showing a pulled state transition process at a time n on the trellis chart illustrated in FIG. 12.
Figure 15:
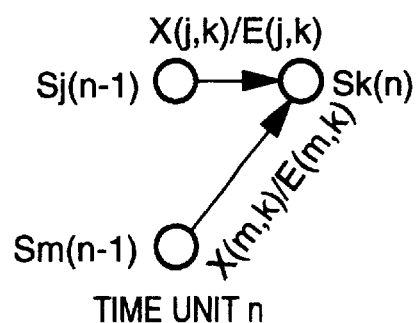
FIG. 15 is an explanatory view showing an example of transition to a state Sk(n) at a time n on the trellis chart illustrated in FIG. 12.

FIG. 13 shows a state transition process at one time unit n drawn out of the trellis chart of FIG. 12. The Viterbi decoding is executed to repeat the process of narrowing the path branches transited to each state of S0(n) to S7(n) to one by estimating an error between the receiving signal value Y(n) and the expected value of the receiving signal {E(j, k)} each time the receiving signal value Y(n) at a time unit n is inputted according to the trellis chart. Hence, the history of the connected path sequences transited to each state of S0(n−1) to S7(n−1) selected by repeating the similar process until the previous time (n−1) is stored as one survivor path sequence P0(n−1) to P7(n−1) for each state. Further, the operation is executed to estimate each of accumulative errors (path metrics) M0(n−1) to M7(n−1) between the expected value sequence of the receiving signal {E(n)} on the path sequence and the actual receiving signal sequence {Y(n)} for each of those survivor path sequences P0(n−1) to P7(n−1) leading to the states S0(n−1) to S7(n−1) and store the accumulative error as the metric indicating the certainty of each survivor path (likelihood). The contents of the survivor path sequences P0(n−1) to P7(n−1) and the path metrics M0(n−1) to M7(n−1) for the states S0(n−1) to S7(n−1) until the time unit (n−1) are updated into P0(n) to P7(n) and M0(n−1) to M7(n−1) by the following process at the next time unit n. This is repeated as a recursive process at each time. As shown in FIG. 15, making a remark on each state on the trellis chart, if the transition from any one of the state Sj(n−1) and the state Sm(n−1) is made possible as the transition to the state Sk(n) at a time unit n, the concrete procedure will be summarized as follows.

(1) By using the expected values E(j, k) and E(m, k) of the receiving signal corresponding to the transitions from the state Sj(n−1) and the state Sm(n−1) against the inputted receiving signal value Y(n), the square errors (branch metrics) BM (j, k) (n) and BM (m, k)(n) for each transition branch are calculated as follows.

Transition branch metric from the state Sj(n−1) to Sk(n):

$$BM(j, k)(n)=(Y(n)-E(j, k))^2$$

wherein ^ means a power operation.

Transition branch metric from the state Sm(n−1) to Sk(n):

$$BM(m, k)(n)=(Y(n)-E(m, k))^2$$

It is known that the metric of the square error gives the most approximate likelihood to estimating the maximum likelihood sequence if the noise sequence convoluted on the receiving signal sequence {Y(n)} is independent white Gaussian noise. The other error estimate such as an absolute value error may be used depending on the feasible decoding condition.

(2) The accumulative errors (path metrics) PM(j, k)(n) and PM(m, k)(n) for comparing the likelihood are calculated for the path sequences transited from each of the states Sj(n−1) and Sm(n−1) to the state Sk(n). Hence, for each of the accumulative errors (path metrics) Mj(n−1) and Mm(n−1) for the survivor paths to the states Sj(n−1) and Sm(n−1) estimated at the process until the previous time (n−1), the state connecting branch metric BM(m, k)(n) calculated at the step (1) is newly added to the path metrics Mj(n−1) and Mm(n−1) by the following adding operation.

Path metric from the state Sj(n−1) to Sk(n):

$$PM(j, k)(n)=Mj(n-1)+BM(j, k)(n)$$

Path metric from the state Sm(n−1) to Sk(n)

$$PM(m, k)(n)=Mm(n-1)+BM(m, k)(n)$$

Further, the path metrics PM(j, k) (n) and PM(m, k)(n) for the two path transitions are compared in magnitude with each other for the purpose of comparing the likelihood. The path metric corresponding to the accumulative error of each path sequence selects a smaller transition path as a more certain and higher likelihood path sequence leading to the state Sk(n) and abandons the other. By using the path metric value of the selected path from the path metrics PM(j, k)(n) and PM(m, k)(n), the content of the new path metric Mk(n) of the survivor path sequence transited to the state Sk(n) is updated.

Surviving path metric leading to the state Sk(n):

$$Mk(n)=Min(PM(j, k)(n), PM(m, k)(na))$$

where Min(. .) is an operation of selecting a minimum value.

(3) The history Pk(n) of the survivor path sequence for the state Sk(n) at a time unit n is updated. The history Pk(n) stores the connection of (D+1) transition states on the survivor paths from the current time n back to a finite time D in time sequence. For example, by referring to the stored content of Pk(n)={Sk(n), Si(n−1), Sj(n−2), ~, S1(n−D+1), Sm(n−D)}, it is indicated that the state transitions on the survivor path sequences leading to the state Sk(n) selected by the process up to the time n are connected and proceeded in the sequence of Sm(n−D)→S1(n−D+1)→Sj(n−2)→Si(n−1)→Sk(n). The operation (2) is executed to selectively determine if the survivor transition path leading to the state Sk(n) at the time unit n is a transition path from Sj(n−1) or a transition path from Sm(n−1). The new history Pk(n) of the selected survivor path sequence is updated as follows by using the history of the survivor path sequence of the state of the path selected from the histories Pj(n−1) and Pm(n−1) of the survivor path sequences for the states Sj(n−1) and Sm(n−1) until the previous time unit (n−1).

The history of the survivor path sequence leading to the state Sk(n):

(When the transition path from Sj(n−1) is selected)

$$Pk(n)=\{Sk(n), Pj(n-1)\}$$

(When the transition path from Sm(n−1) is selected)

$$Pk(n)=\{Sk(n), Pm(n-1)\}$$

The foregoing updating process means an operation of selecting Pj(n−1) or Pm(n−1) according to the selected state transition path, moving back the storage location one time unit by one time unit, taking out the most previous stored content of ((D+2)th element) as a result of the Viterbi decoding, adding the new transition state Sk(n) to the storage location of the latest time, transcribing the added result as the stored content of Pk(n). In general, this operation is executed by a storage circuit such as a shift register for sequentially shifting the stored content at each time unit. Further, in many cases, as the stored content to Pk(n), in place of storing the information (state number) itself of the selected transition state, the transmitting code for the path branch to the selected transition state may be stored. For example, if the transition path from the state Sj(n−1) is selected as a survivor transition path for the state Sk(n) at the time unit n, the content recorded in the history of the survivor path may be the value of the transmitting code X(j, k) corresponding to the path branch from the states Sj(n−1) to Sk(n). Hence, in the case of referring to the stored path history information, the transmitting code sequence {X(n)} indicating the survivor path may be immediately obtained as a decoded result.

The foregoing series of Viterbi decoding processes of (1), (2) and (3) are repeated each time the receiving signal value Y(n) at each time unit is inputted. The concrete components for embodying this process are exemplarily shown in FIG. 16. The calculation of the branch metrics BM(j, k)(n) and BM(m, k)(n) described with respect to (1) is executed by a squared error operating circuit 30. The path metrics Mj(n−1) and Mm(n−1) of the survivor paths are held by metric storing circuits 31a and 31b. The calculations of the path metrics PM(j, k) (n) and PM(m, k) (n) described with respect to (2) are executed by a metric accumulating circuit 32. The comparison of the metrics is done by a comparator 33. The compared result is outputted to a metric selecting signal 34. Then, a metric selecting circuit 35 operates to select any one of the path metrics PM(j, k) (n) and PM(m, k) (n) according to this selecting signal 34. By using the selected metric, the content of a metric storing circuit 31c for holding the survivor path metric Mk(n) to the state Sk(n) is updated and stored in the circuit 31c. On the other hand, the survivor path histories Pj(n−1) and Pm(n−1) leading to the states Sj(n−1) and Sm(n−1) are stored in path history storing circuits 35a and 35b. The content of the survivor path history Pk(n) leading to the state Sk(n) described with respect to the operation (3) is updated by referring to a selected one of the path history storing circuit 35a or 35b indicated by the selecting signal 34 through the effect of a path history selecting circuit 36. The storage location of the content is shifted by one time unit so that it is newly updated as the content of the path history storing circuit 35c for holding Pk(n). At this time, the survivor path history information selected from the storage location located at the tail of the path history storing circuit 35a or 35b is outputted as the decoded result.

The actual Viterbi decoding is required to individually execute the processes of (1) to (3) for the receiving signal Y(n) at each time unit in all the states of the trellis chart for which the maximum likelihood sequence is estimated. Hence, the actual Viterbi decoder is arranged to locate the components for the process for the state Sk(n) shown in FIG. 15 by the number of states. For the trellis chart shown in FIG. 13, as shown in the arrangement of the Viterbi decoder shown in FIG. 14, the totally eight components shown in FIG. 15 allocated to each of the eight states M0(n) to S7(n) are located in parallel. At this time, the metric storing circuits 31a to 31h for storing the survivor path metrics M0(n) to M7(n) and the path history storing circuits 35a to 35h for storing the survivor path sequence histories P0(n) to P7(n) are respectively allocated to the states S0(n) to S7(n). The referring destinations of the storing circuits are connected to plural spots according to the next-stage connecting state of each state on the trellis chart. For example, if the path connecting relation of the trellis chart exists between the state Sk(n) and the state Sj(n+1) (k, j=0, 1, to 7), one of the referring destinations of the metric storing circuits allocated to the state Sk(n) is one adding input of the metric accumulator allocated to the state Sj(n) to the branch metric BM(k, j) (n), while one of the referring destinations of the path history storing circuit allocated to the state Sk(n) is made to be an input of the path history selecting circuit allocated to the state Sj(n). Since the expected value E(j, k) of the received signal on the actual trellis chart is often common to some path branches, the square error operating circuit for doing an operation about the branch metric is also common to those path branches. Thus, it is actually arranged that the expected value is often inputted to the corresponding number of metric accumulators.

Figure 14:
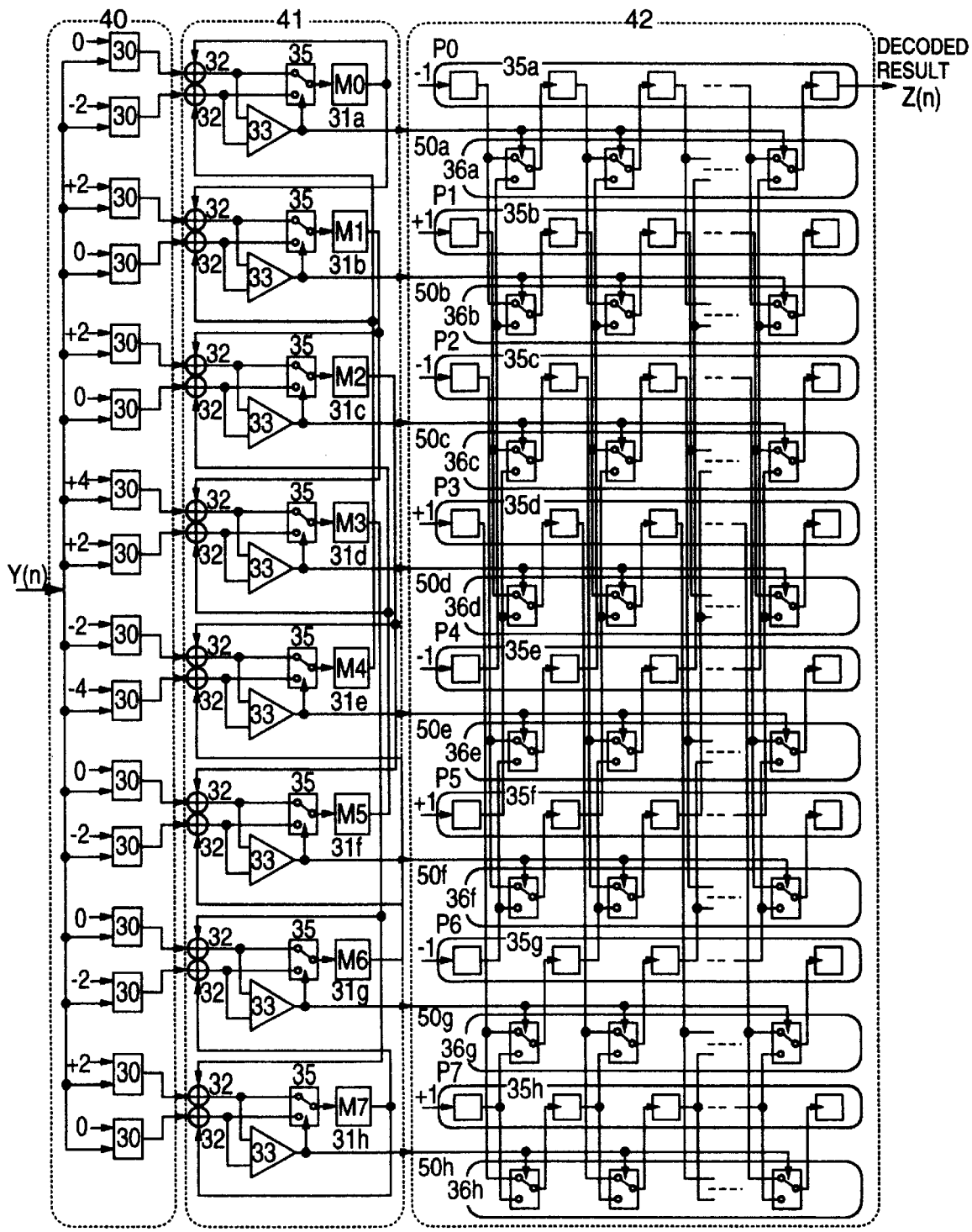
FIG. 14 is a block diagram showing an exemplary arrangement of a general Viterbi decoder the present inventors has considered.
Figure 16:
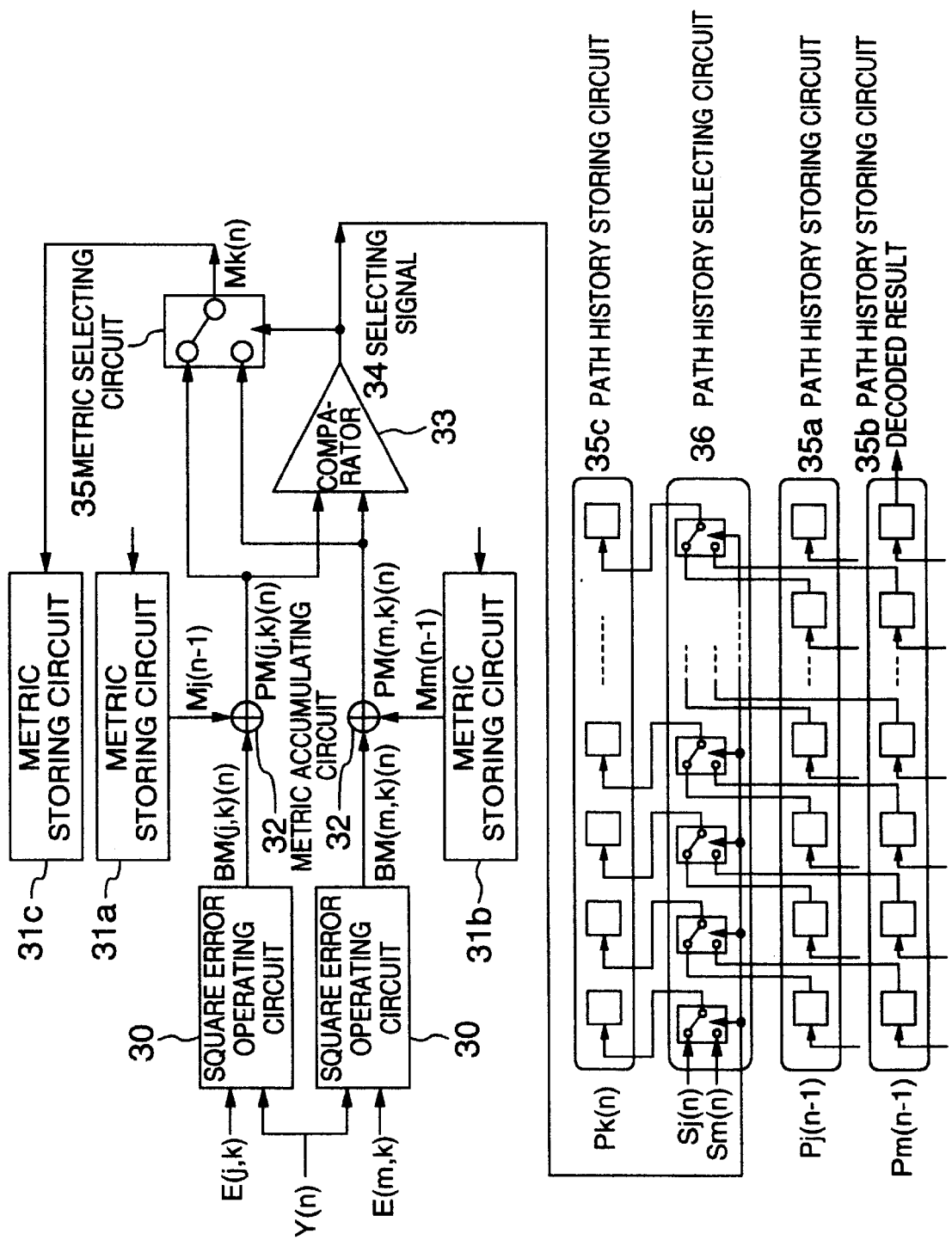
FIG. 16 is a conceptual view for concretely describing the method of the present inventors for implementing the maximum likelihood sequence detecting (Viterbi decoding) method based on the Viterbi algorithm.

As summarized as shown in FIG. 14, the arrangement of the Viterbi decoder is roughly divided into a branch metric operating unit (BMU) 40 for being inputted with the receiving signal Y(n) and doing the process (1) for the receiving signal Y(n), a path metric add-compare-select unit (ACS) 41 for executing the process (2) about the branch metric output and selecting the survivor path to each state, and a survivor path memory unit (PMU) 42 for being inputted with the selected output, updating and storing the survivor history by doing the process (3), and determining the narrowing of the decoded result.

The foregoing process is a general method for embodying and arranging the Viterbi decoding process invented by the inventors of the present application.

Figure 17:
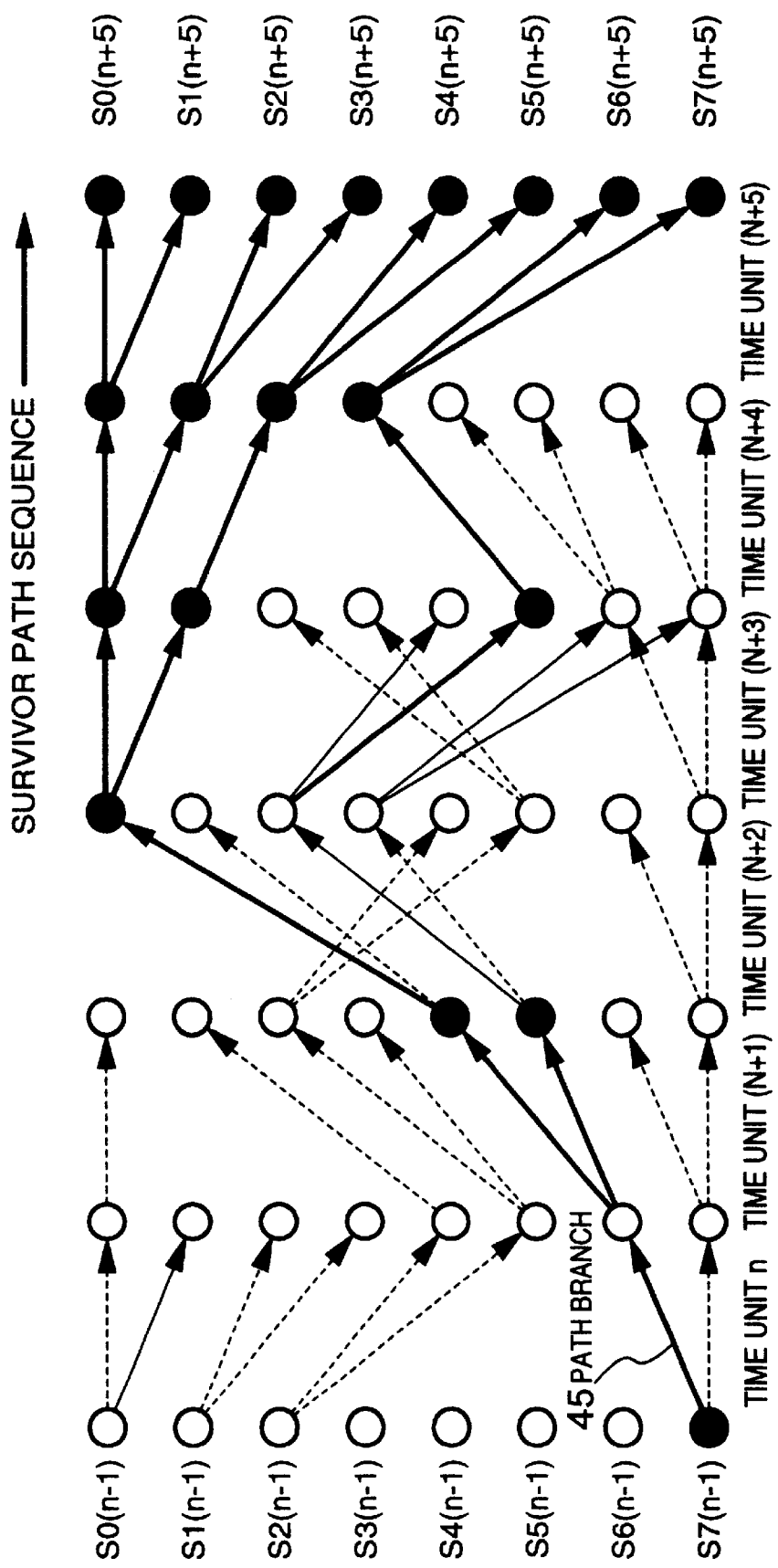
FIG. 17 a conceptual view showing an example of a process from the selection of the survivor path to the establishment of the decoded result in the Viterbi decoding process.

In turn, the description will be oriented to the operation of the path memory 42 included in the Viterbi decoder illustrated in FIG. 14. For the sake of explanation, the process is indicated from the selection of the survivor path to the decision of the decoded result in the Viterbi decoding process with reference to FIG. 17. According to the foregoing method for embodying the Viterbi decoder and the arrangement of the Viterbi decoder, the survivor path sequence to each state on the trellis chart is repetitively selected for the receiving signal sequence {Y(n)} at each time unit. By this repetitive selection, the path sequence survived at each time unit is more gradually narrowed. For example, as shown in FIG. 17, the eight survivor path sequence to each of the states, selected at each time unit n, is progressively discarded by selecting the path thereafter. Finally, until the selection is terminated at the time unit (n+5), the connected survivor path sequences 33 are converted into one. By this, the decoded result Z(n) at the time unit n is determined by referring to the transmitting code X(j, k) for only one survivor path branch 45. The narrowing (path discard) of the survivor path sequences is nothing but an operation of moving back the content of the path history Pj (n−1) or Pm(n−1) selected in the decoding process (3) one time unit by one time unit and transcribing it as the stored content of the new Pk(n). The general arrangement of the path memory 42 for doing this process invented by the inventors of the present application is pulled out of the arrangement shown in FIG. 14 again. The resulting arrangement corresponds to that shown in FIG. 18. The initial values for the fixed node states S0(n) to S7(O) allocated to the survivor paths are set to the storing elements located in the left hand of the path history storing circuits 35a to 35h. For example, the transmitting codes X(0, 0) and X(4, 0) on the two transition path branches to the state S0(n) allocated to the path history storing circuit 35a are both set as "−1". Hence, for the storing element located in the left hand of the path history storing circuit 35a, a value of "−1" is constantly set to the transmitting code (decoded code). For the storing elements located in the left hand of the path history storing circuits 35b to 35h, likewise, a value of "−1" or "+1" is initially set to the transmitting code (decoded code). The content of the storing element is selectively referred according to the indication of the selecting signals 50a to 50h of each state survivor path outputted from the path metric comparing and selecting unit 41. At a next time, the content of the selected storing element is shifted as the content of the storing element to be referenced and located in the right adjacent stage and then is updated. According to the selecting signals 50a to 50h at each time unit, the decoded codes are sequentially taken out of the right hand of the path history storing circuits 35a to 35h as replacing the content of each storing element and moving to the right hand. This kind of possible method for composing a path memory of the Viterbi decoder is called the exchange method.

As set forth above, the Viterbi decoder operates to secure a decoding delay during an interval D until the survivor path is converged and to measure the sufficiently long receiving signal sequence {Y(n)} for the decoding process, which makes great contribution to enhancing decoding reliability. Hence, for securing the decoding performance, it is prerequisite to locate the path history storing circuits 35a to 35h for holding the information of the survivor path sequence leading to each state for a length of time of the period D. To restrict the converging period D (path memory length) within a certain length, the coder 11 often gives a given constraint condition to the transmitting code sequence {X(n)}. By this operation, it is possible to conform to a run-length limitation of a specific signal value and a periodic appearance of a specific signal pattern for the receiving signal sequence {Y(n)}, confine the period of the continuation of the receiving signal sequence {Y(n)} in which the likelihood difference does not clearly take place (cannot be discriminated) to a lower length than a given value, and secure the decoding code sequence {Z(n)} in the finite period D.

Normally, the path memory length D of the Viterbi decoder is designed to be long enough to converge the survivor paths into one and determine one path by considering the constraint condition imposed by the transmitting codes and the number of the states and the connecting structure of the trellis chart so that the decoding reliability may not be remarkably lowered in a specific transmitting code sequence {X(n)}. Hence, the output coincident results of the converged path are the presupposition to the decoded result Z(n) outputted from each of the path history storing circuits 35a to 35h. Normally, it means that any one of the output results of the path history storing circuits 35a to 35h is selected and outputted as the decoded result. In some types of rare convolutions of noise sequences onto the receiving signal sequence {Y(n)}, for the designed finite path memory length D, the path convergence as well as the coincidence of the decoded results may be prevented. In those cases, the operation is executed to select an output from the path history storing circuit having the survivor path metric Mk (n) having the maximum likelihood from the path history storing circuits 35a to 35h and output it as the decoded result. In place, by using means for taking a decision-by-majority logic for the output of each history storing circuit, the decoded result may be determined and outputted.

Figure 18:
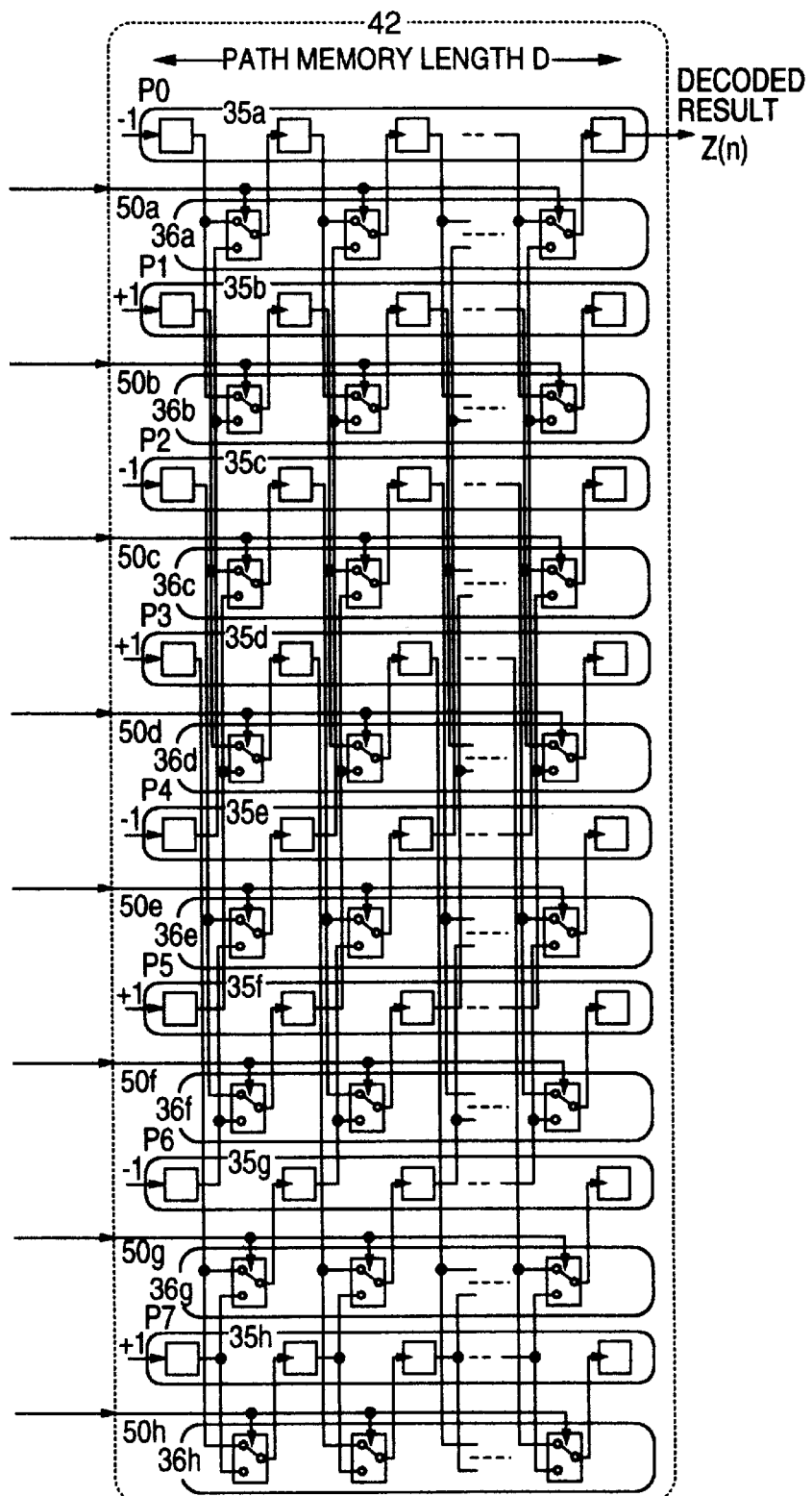
FIG. 18 is a conceptual view showing a path memory pulled out of the arrangement of the general Viterbi decoder considered by the present inventors as illustrated in FIG. 14.

The possible general arrangement of the path memory shown in FIG. 18 involves the movement of all the stored contents at each input of the receiving signal Y(n) at each time unit. As stated above, it is necessary to design the path memory length D as considering the maximum period when the non-corvergence of the survivor paths may be continued. Hence, within many decoding times, each of the path history storing circuits 35a to 35h just moves each convergence-completed survivor path information, that is, the coincident stored contents. If the receiving signal is in the relatively excellent noise condition from a practical level, or if the transmitting code sequence {X(n)} is in a random state without deviation to an unfavorable sequence to deciding the likelihood or the survivor path convergence, the average necessary period until the survivor path convergence is completed is about one-third to one-fifth of the path memory length D. The latter half circuit portion of the remaining two-thirds to four-fifths of the path memory consumes an electric power for a circuit operation only for moving the storage location of the determined decoded result.

The arrangement of the path memory of the Viterbi decoder according to an embodiment of the decoding circuit of the invention provides means for stopping data movement of the decoded result after the convergence in the normal path memory operation as well as stopping the operation of the update and storage, thereby reducing the power consumption in the decoding circuit.

Figure 1:
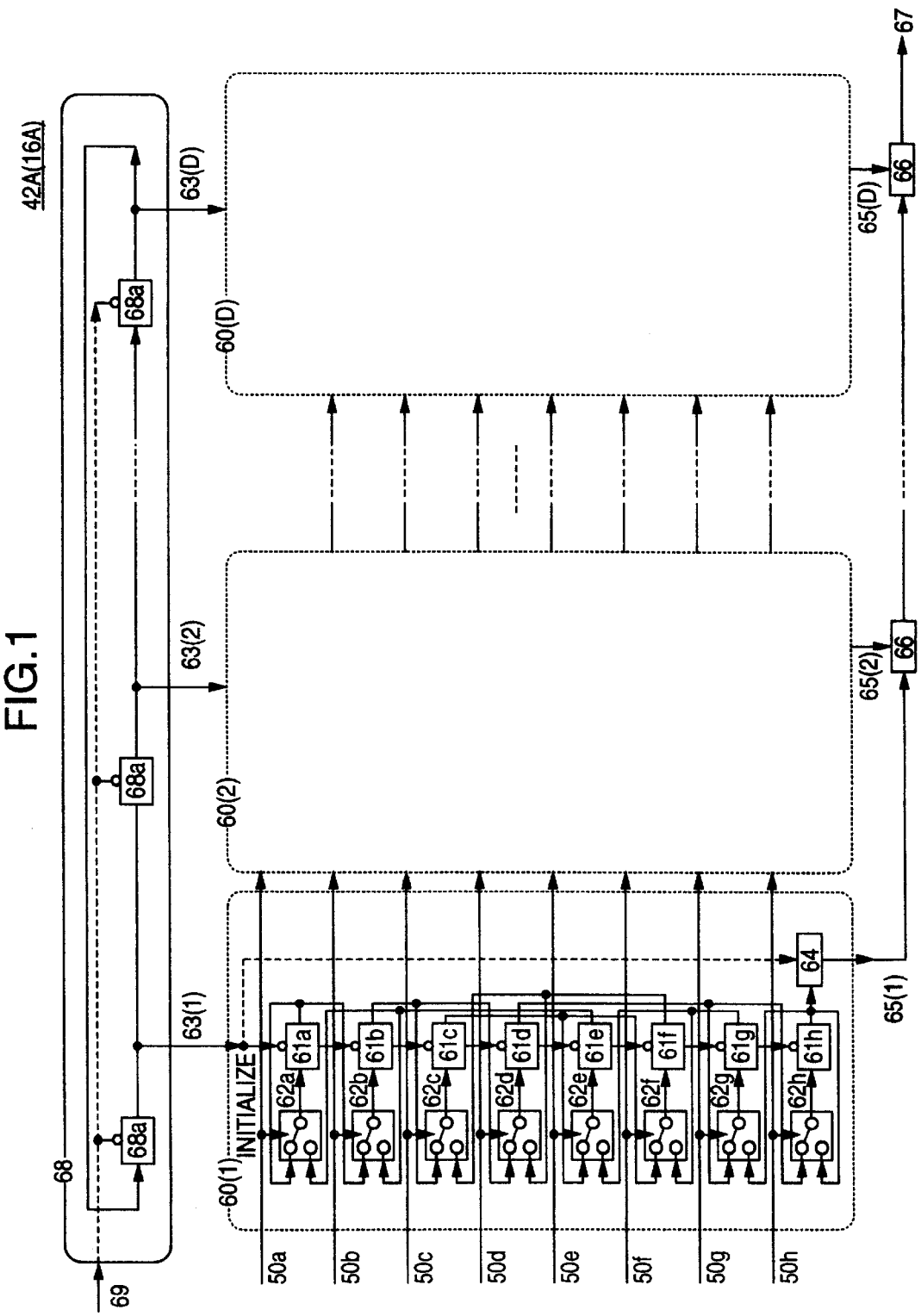
FIG. 1 is a conceptual view showing an exemplary arrangement of a path memory of a Viterbi decoder (maximum likelihood sequence detector) according to a first embodiment of a decoding circuit of the invention.

FIG. 1 is a conceptual view showing an example of an arrangement of the path memory 42A of the Viterbi decoder (maximum likelihood sequence detector 16A) according to the first embodiment of the decoding circuit of the invention.

In this embodiment, eight storing elements 61a to 61h for storing the state survivor path information at the same time located in a column, included in the path history storing circuits 35a to 35h shown in FIG. 18, are treated as a group of storing elements 60(1) to 60(D) for corresponding to the states S0(n) to S7(n). The output of each of the storing elements 61a to 61h is added into the input of the corresponding storing element in the same storing element block through the path history selecting circuits 62a to 62h. For example, the output of the storing element for the state S0(n) is recursively connected to the input of the input selecting circuits (path history selecting circuits 62a and 62b) of the storing elements 61a and 61b for the states S0(n) and S1(n) to be transited. This connection is a rearranged one of FIG. 18. Concretely, in FIG. 18, the output of each storing element is connected to an input of the path history circuit at a right adjacent stage, while the output of each storing element is connected to the input of the path history circuit of the input of the storing element at the same stage contained in the same storing element block as keeping the correspondence of the transit state. The selecting signals 50a to 50h from the path metric comparing and selecting unit 41 and the operations of the path history selecting circuits 62a to 62h and the storing elements 61a to 61h according to the selecting signals 50a to 50h are the same as the arrangement shown in FIG. 18. Further, each storing element provides an initializing function of setting the similar initial values set to each left-hand storing element of the path history storing circuits 35a to 35h shown in FIG. 18 by starting signals (pointers) 63(1) to 63(D) for the corresponding storing element blocks 60(1) to 60(D) given from the external.

When the starting signals (pointers) 63(1) to 63(D) are inputted, a storing element block output circuit 64 (simply composed of a logical product of a storing element output and a starting signal) for outputting the contents of the storing elements 61*a* to 61*h* and storing element block output terminals 65(1) to 65(D) are provided in the storing element blocks 60(1) to 60(D). The storing element block output terminals 65(1) to 65(D) may uniquely output the contents of the storing elements for a specific state of each storing element block like the first embodiment. In place, in the case of selecting the decoded result by comparing the path metric Mk(n) or deciding the decoded result based on a decision-by-majority logic, the similar storing element block output circuit and the storing element block output terminal may be provided in the similar storing element block output circuit. Each of the storing element block output terminals 65(1) to 65(D) from each storing element block is collected as an input of an OR circuit 66 and outputted as an output 67 of the path memory circuit (If each storing element block provides plural output terminals, the output terminals are collected in the OR circuit 66 at each storing element output in the same state and are supplied as plural path memory circuit outputs 67.)

As described above, the path memory 42A may be arranged by composing each of D storing element blocks 60(1) to 60(D) of the same arrangement and cascading these blocks. This arrangement implements the present path memory 42A to be suitably and favorably mounted on the very large integrated circuit.

Further, a starting signal (pointer) generating circuit 68 is provided for generating the starting signals (pointer) 63(1) to 63(D) for sequentially starting the storing element blocks 60(1) to 60(D). This starting signal (pointer) generating circuit 68 operates to periodically generate the starting signals (pointers) 63(1) to 63(D) for the storing element blocks 60(1) to 60(D) on the input timing of the receiving signal Y(n) at each time unit in a certain sequence. For example, the starting signal (pointer) generating circuit 68 is realized by a ring counter as shown in FIG. 1 in which the I/Os of D storing elements 68*a* are circularly connected in series. The storing element 68*a* of the staring signal (pointer) generating circuit 68 is set to be initialized by the path memory starting signal 69 at the start of the decoding process so that only one starting signal may be outputted. Hence, the starting signal is outputted as shifting the signal one time unit by one time unit at each time interval D. The initializing and the block output of the storing elements in each of the storing element blocks 60(1) to 60(D) are executed on the timings shifted from each other in a certain sequence and at each time interval D.

In the arrangement according to the first embodiment of the invention, in FIG. 18, the movement of each stored content from the left hand to the right hand of the storing elements caused in the path history storing circuits 35*a* to 35*h* is recursively executed on the storing elements 61*a* to 61*h* in the same storing element block. The convergence of the survivor paths is completed and the contents of all the storing elements 61*a* to 61*h* in the storing element block are made the same as each other. The further update of the storing element does not bring about the change of the substantial content stored in the storing elements 61*a* to 61*h*. This stops the active transition operation (switching operation) of the electronic element composing the storing elements 61*a* to 61*h*, which in principle leads to lowering the power consumption of each storing element. (The content transit of the storing element 68*a* in the starting signal (pointer) generating circuit 68 is constantly caused by one storing element, so that the power consumption of the storing element 68*a* should not be considered.) This is a new effect that cannot be obtained by the path memory 42 of the general possible arrangement illustrated in FIG. 18. Further, the rewrite of the same content to each storing element is not required if the coincidence of the content is completed in the storing element. Thereafter, what is required is only the retention and reference of the stored content. In order to enhance the effect of reducing the power consumption, it is preferable to stop the supply of the operating clock signal to the storing element block where the coincidence of the content of the storing element is completed after the convergence of the survivor path information is terminated.

Figure 19:
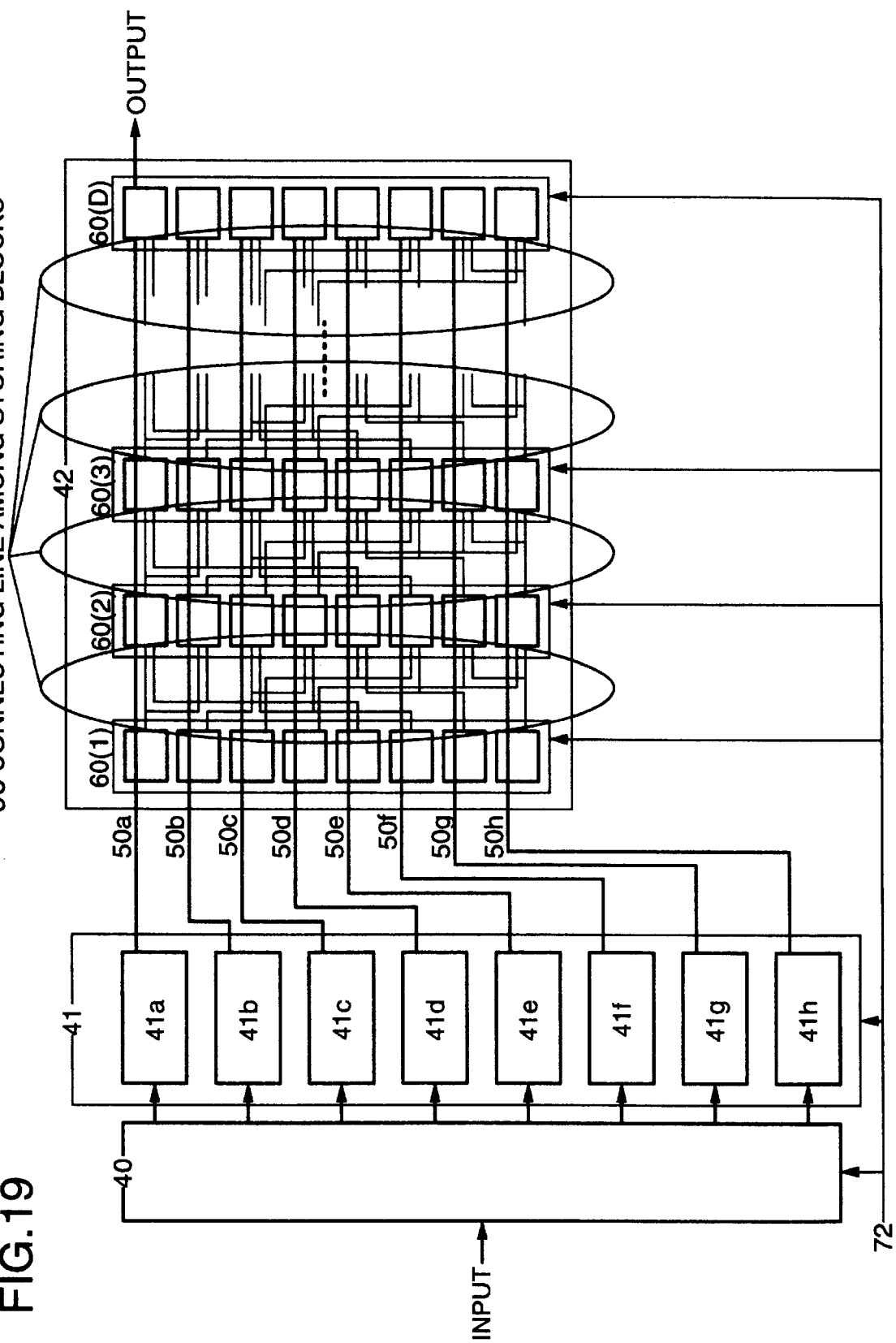
FIG. 19 is a conceptual view showing an example of a layout in the case of integrating the general Viterbi decoder considered by the present inventors and illustrated in FIG. 14.

The general arrangement of the path memory 42 as shown in FIG. 14 (FIG. 18) needs the movement of the stored content among the storing element blocks 60(1) and 60(D). As illustrated in the circuit layout of FIG. 19, in integrating the circuit, it is necessary to provide a connecting wire 90 among the storing element blocks 60(1) and 60(D).

Figure 4:
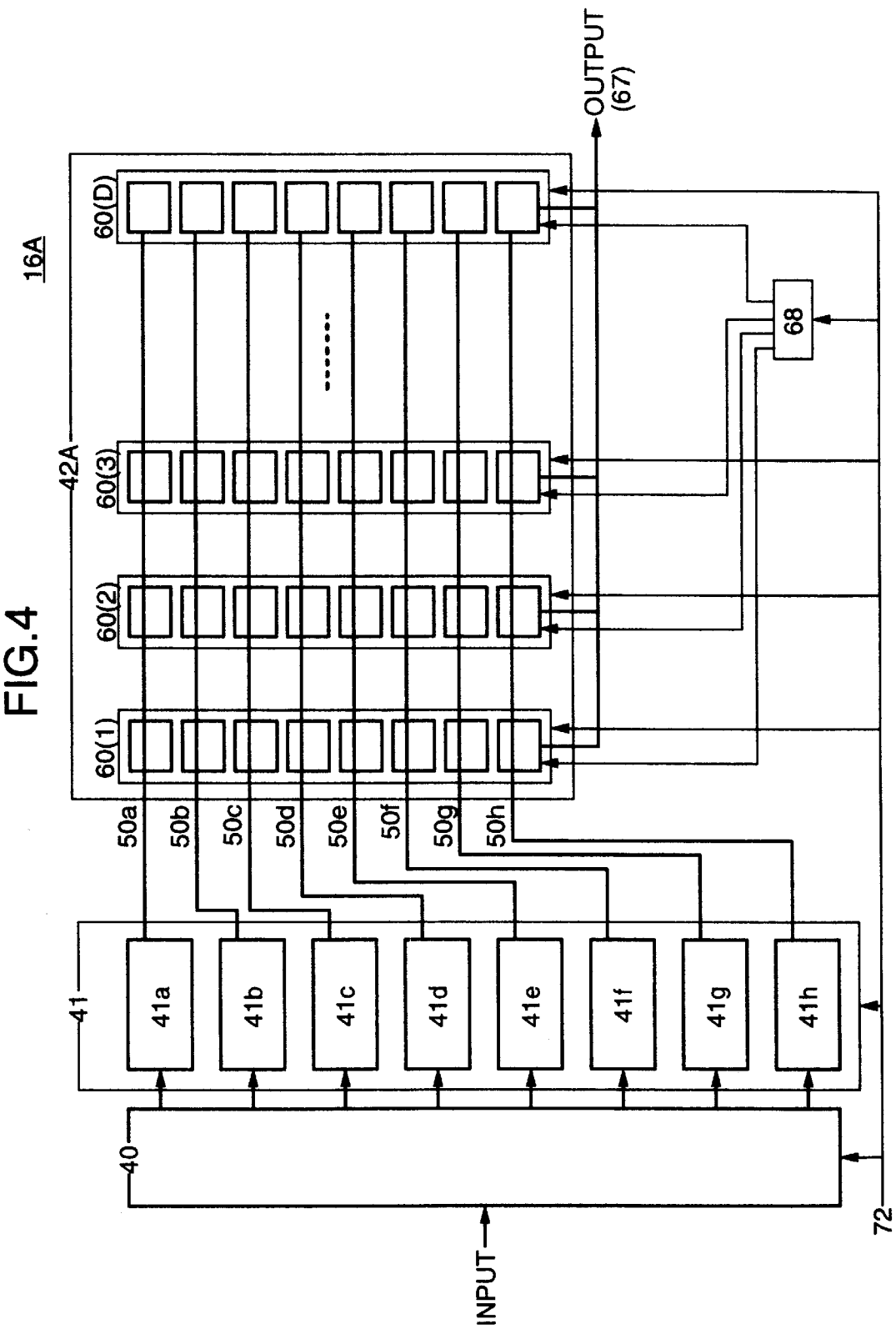
FIG. 4 is a conceptual view showing an exemplary layout in integrating a Viterbi decoder (maximum likelihood sequence detector) according to the first embodiment of the decoding circuit of the invention.

On the other hand, when integrating the maximum likelihood decoding circuit containing the path memory 42A according to the embodiment of the invention, as compared with the general arrangement of the path memory 42 shown in FIG. 14 (FIG. 18) as stated above, the integrated circuit does not bring about the movement of the stored content among the storing element blocks 60(1) to 60(D). Hence, as illustrated in the circuit layout of FIG. 4, it does not need an intra-block connecting wiring for moving the stored content. Further, the repetitive array layout of the storing element blocks 60(1) to 60(D) of the path memory 42A puts a more advantage to the integration. In addition, the probability of causing defects such as a wiring one is reduced, which leads to a higher yield in the manufacturing process.

Figure 2:
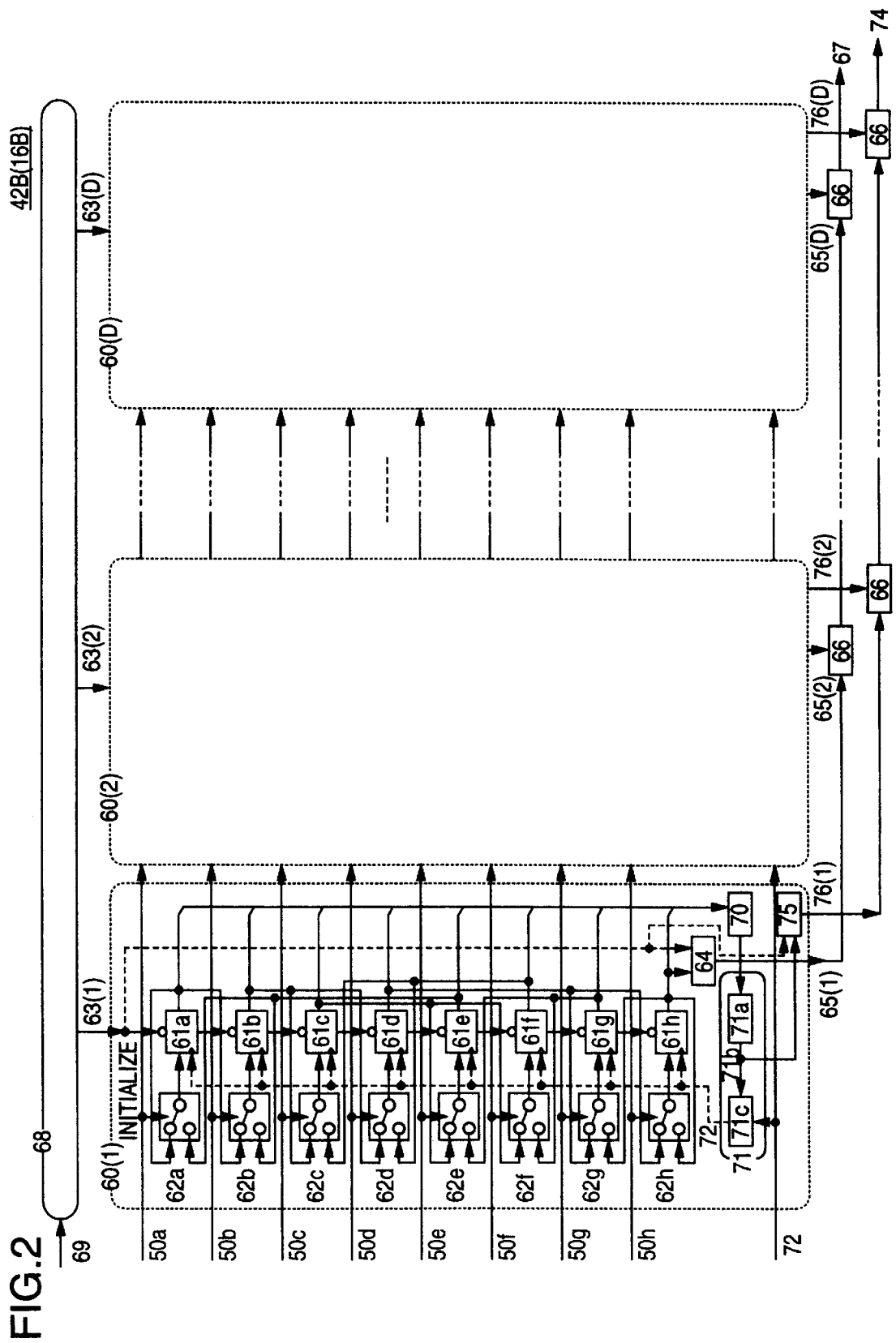
FIG. 2 is a conceptual view showing an exemplary arrangement of a path memory of a Viterbi decoder (maximum likelihood sequence detector) according to a second embodiment of the decoding circuit of the invention.

FIG. 2 illustrates an exemplary arrangement of the path memory 42B included in the Viterbi decoder (the maximum likelihood sequence detector 16B) according to the second embodiment of the decoding circuit of the invention. This arrangement implements a function of stopping supply of an operation clock signal to the storing element block if the contents of the storing elements are matched to each other. The Viterbi decoder according to the second embodiment of the invention provides a state coincidence circuit 70 (that may be easily realized by an exclusive OR circuit) for referring to all or part of the outputs of the storing elements 61*a* to 61*h* in each of the storing element blocks 60(1) to 60(D) and detecting the coincidence of the stored contents in addition to the arrangement of the first embodiment illustrated in FIG. 1. Further, in response to the detected output from the state coincidence circuit 71, the Viterbi decoder provides a clock breaking circuit 71 for breaking supply of a clock signal to the storing element block in each storing element block. An arrangement of the clock breaking circuit 71 is shown in FIG. 2. The state holding storing element 71*a* operates to refer to the output of the state coincidence circuit 70, hold the state of match or mismatch on a constant timing, and then determine the output of a clock breaking signal 71*b* during a null period of the clock signal 72. The clock breaking circuit 71 operates to control stop/supply of a clock signal 72 for operating the storing elements 61*a* to 61*h* through the clock breaking element 71*c* that may be easily implemented by the AND element) through the clock breaking signal 71*b*. The stopping state of the clock signal is released when the input of a starting signal to the storing element block initializes the contents of the storing elements 61*a* to 61*h* and the state coincidence circuit 70 detects mismatch of the outputs from the storing elements.

Further, the Viterbi decoder according to the second embodiment of the invention can get to know if the decoded result is obtained after the convergence of the survivor paths is completed or if it is obtained without the convergence at each decoded code when the storing element block output terminals 65(1) to 65(D) of each of the storing element blocks 60(1) to 60(D) output the decoded code. As stated above, the path memory length (number of storing element blocks) D is set to be long enough to converge the survivor paths. The non-convergence of the paths may often reflect the abnormality in the receiving signal sequence {Y(n)} or the degrade of a noise state. In any case, the non-convergence of the survivor paths indicates the decision of the likelihood is not sufficient in estimating the maximum likelihood, which signifies that the reliability of the decoded result is made lower at this time. Hence, according to the present invention, simultaneously with the output of the decoded code, the path memory 42B operates to refer to the output of the state coincidence circuit 70 or the state holding storing element 71a and output it as a decoding reliability flag 74 to the decoded result together with the decoded result. Hence, each of the storing element blocks 60(1) to 60(D) provides a decoding reliability flag output circuit 75 (that may be easily composed of an AND of the output content and the starting signal) for feeding an output of the state coincidence circuit 70 or a content of the state holding storing element 71a in response to the inputs of the starting signals (pointers) 63(1) to 63(D) and decoding reliability flag output terminals 76(1) to 76(D). The decoding reliability flag output terminals 76(1) to 76(D) from the storing element blocks are collected as an input of the OR circuit 66 and are served to output the decoding reliability flag 74 together with the decoded code fed from the path memory circuit output 67. This makes it possible to output an effective signal of the decoding reliability flag 74 against the decoded output when the survivor paths are mismatched to each other, thereby warning the later stage of the decoding circuit of a high probability that the decoded output contains an error (low decoding reliability). By using the decoding reliability flag, the device located at a later stage may keep the decoding reliability in various forms of techniques, concretely, the device may:

(1) indicate where the decoded information of low reliability is located in advance in doing the process with an error-correcting code for the purpose of enhancing the correcting capability (correct an erasure bit), (2) enter the receiving signal by re-transmitting the transmitting code or re-reading a reproduction signal with respect to the decoded data portion of low reliability, for retrying the decoding process, and (3) predict an abnormal state or lower quality in an information transmitting system or an information recording and reproducing system.

The output function and arrangement of the decoding reliability flag 74 added to the second embodiment may be embodied in the arrangement shown in FIG. 18 and FIG. 3 (to be discussed below). The arrangement may be easily realized by referring to the output information from the storing element located in the rightmost end of each of the path history storing circuits 35a to 35h, referring to the information as the input of the state coincidence circuit 70, and outputting the result.

Figure 3:
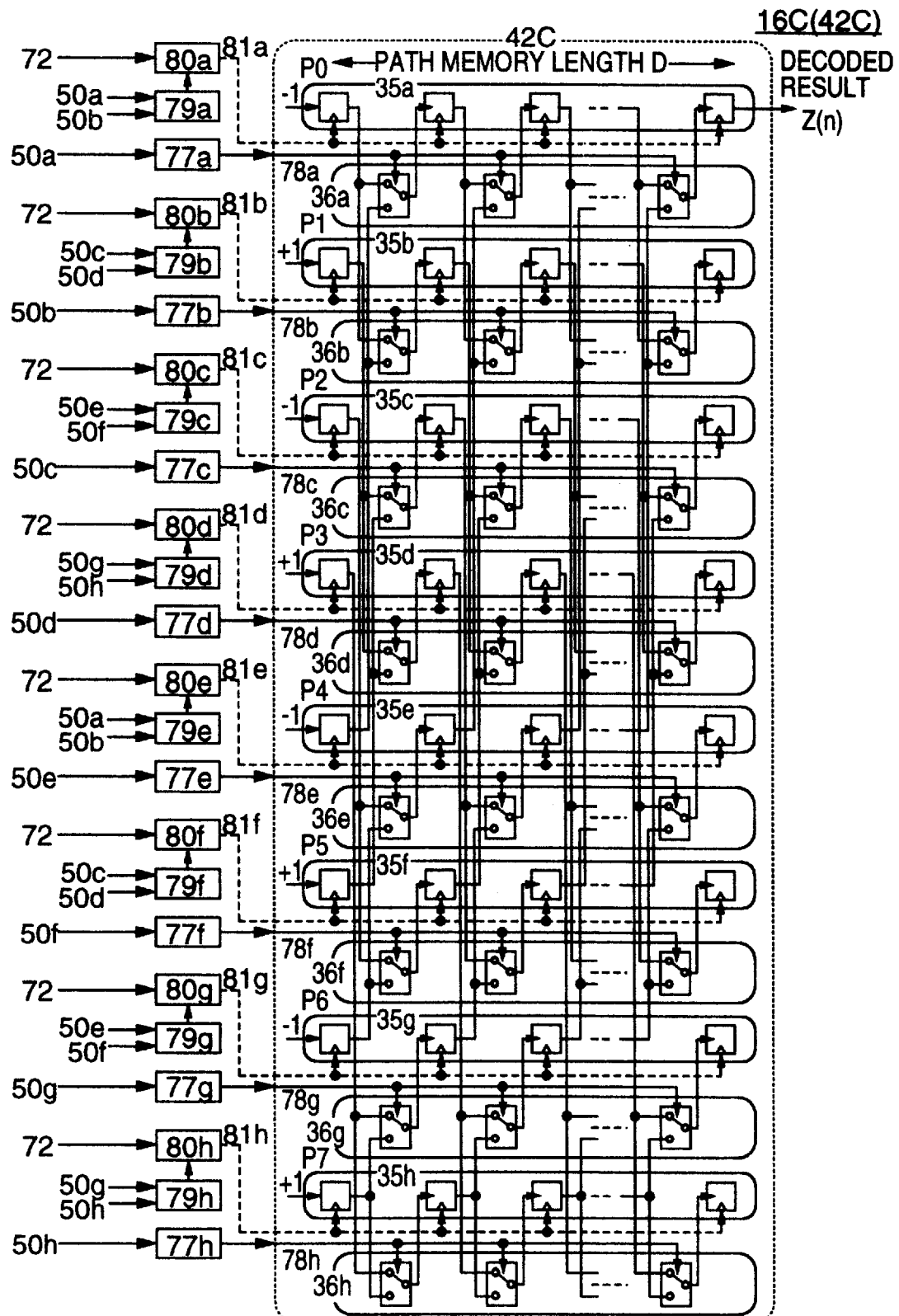
FIG. 3 is a conceptual view showing an exemplary arrangement of a path memory of a Viterbi decoder (maximum likelihood sequence detector) according to a third embodiment of the decoding circuit of the invention.

Further, according to the present invention, like the second embodiment shown in FIG. 2, an exemplary method for composing the maximum likelihood sequence detector 16C containing the path memory 42C provided with a function of effectively stopping the operation clock to be fed to the portion that is not required to be operated is illustrated as the third embodiment in FIG. 3.

According to the third embodiment, the arrangement of the path memory 42 illustrated in FIG. 18 provides selecting signal storing elements 77a to 77h for temporarily storing selecting signals to be sent to the path history selecting circuits 36a to 36h. This makes it possible to temporarily delay the information of the selecting signals 50a to 50h and convey the information to the path history selecting circuits 36a to 36h. This third embodiment is arranged to store the information of the selecting signals 50a to 50h in the selecting signal storing elements 77a to 77h, buffer the information for a while, and then hold the content of the information. The outputs are previous time selecting signals 78a to 78h. By referring to each of the selecting signals 50a to 50h at a next time, it is determined if the content updated by the previous time selecting signals 78a to 78h given to the path history storing circuits 35a to 35h is referenced by the selection on the selecting signals 50a to 50h at the next time unit. This is done by the selecting signal deciding circuits 79a to 79h. For example, the selecting signal deciding circuit 79a operates to refer to the selecting signals 50a and 50b at a next time unit to be given to the path history selecting circuits 36a and 36b of the states S0(n) and S1(0) where the state S0(n) is transited (where each storing element of the path history storing circuit 35a feeds an output), for the purpose of determining if the content of the path history storing circuit 35a against the state S0(n) at the next time unit is selected. If neither of the selecting signals 50a and 50b indicate the selection of the content of the path history storing circuit 35a in the state S0(n), a signal for indicating "no selection" is outputted. (This may be easily embodied by an OR or an AND of the selecting signals.)

Further, the other selecting signal deciding circuits 79b to 79h are arranged similarly. Those circuits utilize the method shown in FIG. 2 for referring to the selecting signals 50a to 50h at the previous time unit and lookahead-determine if the contents of the corresponding path history storing circuits 35b to 35h thereto are selected at the next time unit. The determined result is outputted. In a case that these selecting signal deciding circuits 79a to 79h output "no selection", the content of the corresponding path history storing circuit is replaced with the content of the other path history storing circuit at the next time unit or later if the content of the former circuit is updated by the selecting signal of the previous time unit held in the selecting signal storing element and then is discarded from the path memory. Hence, for the storing element of the path history storing circuit, it is not necessary to update the stored content by the selecting signal of the previous time unit indicated by the output of the selecting signal storing element. As a result, in a case that the clock braking circuits 80a to 80h receive the output from the selecting signal deciding circuits 79b to 79h and are determined as "no selection", those circuits 80a to 80h operate to break the operation clock signals 81a to 81h of the corresponding path history storing circuits for operating each storing element. By this breaking, the storage update of the path history storing circuits 35a to 35h indicated by the selecting signals 78a to 78h of the previous time held in the selecting signal storing elements 77a to 77h is stopped for one clock. (This may be easily implemented by the AND or the OR of the output of the selecting signal deciding circuit and the operation clock signal of the path history storing circuit.) As described above, the path memory according to the third embodiment is arranged to lookahead scan the selecting signal for predicting the state to be discarded from the survivor path at the next time unit or later and stopping the update of the content of the corresponding path history storing circuit. This operation makes it possible to reduce the power consumption of the path memory 42C. Moreover, the math memory of this third embodiment may be arranged so that the stages of the selecting signal storing elements 77a to 77h are piled and the lookahead time and number of the selecting signals 50a to 50h are increased further. This arrangement makes it possible to more efficiently and effectively predict the path history storing circuits 35a to 35h that do not need to update their contents, thereby enhance the effect of reducing the power consumption. This may be easily implemented by the expansion with the similar method as described about the third embodiment.

As set forth above, the arrangement of the path memories 42A to 42C of the Viterbi decoder according to each embodiment of the decoding circuit of the invention does not put any restriction and requirement on the peripheral devices and circuits and may be applied to any embodiment of the general Viterbi decoding device and circuit. Further, each embodiment has been illustrated with an example of the EPR 4 channels in the corresponding trellis chart (see FIG. 12). This embodiment is not restricted by the structure of the trellis chart and may be easily expanded for the process of presuming the maximum likelihood sequence in the trellis chart (Markov state transition chart) having more numerous states and more state transition paths and various state transition connecting structures. Hence, the present invention may be applied to any kind of circuit (integrated circuit) and device with the Viterbi decoding process as well as the information communications device, the information recording and reproducing apparatus, and the information processing and signal processing apparatus. The invention may apply the similar effect of reducing the power consumption to those circuits and devices.

Moreover, this embodiment of the invention may be easily checked by a specific receiving signal sequence given from the external. As mentioned above, the effect of the present invention depends on the convergence of the survivor paths in the path memory circuit. Hence, by entering a specific receiving signal sequence pattern from which a code sequence with inferior convergence, for example, a constraint condition for converging the survivor paths in the path memory length D to be normally added to the transmitting codes is intentionally cleared, the power consumption of the path memory circuit according to an embodiment of the invention is made maximum. This is because the non-convergent state of the survivor paths in the path memory is constantly continued by an intentional pattern input, so that the convergence-based coincidence of the storing elements and the operation stop of the storing elements do not take place and all the storing elements of the path memory circuit are constantly in operation. The power consumption in this case is substantially same as that of the general possible path memory shown in FIG. 18. Or, the power consumption of the path memory of this invention is somewhat higher because of the power consumption in the additional circuits. The intentional pattern for producing the non-convergent state of the survivor paths inside of the path memory may be implemented by giving continuous 0s (no signal input) to the Viterbi decoder as the receiving signal sequence $\{Y(n)\}$. In all the linear transmitting codes, the opposite code sequence $\{X(n)\}$ (the pair of code sequences with opposite signs to each other at each time unit) normally correspond to the opposite receiving signal expected value sequence $\{E(n)\}$ (the receiving signal sequence with the same amplitude and opposite polarity at each time unit). Hence, by inputting the receiving signal sequence $\{Y(n)\}$ (no signal input state) of continuous 0s, no likelihood difference cannot be given to the pair of opposite transmitting code sequence $\{X(n)\}$ in estimating the maximum likelihood. It means that the pair of codes is kept residual in the path memory as the survivor path with the similar certainty (decoding candidate sequence) and the constant path non-convergent state takes place in the path memory. Since the survivor path at this time corresponds to the opposite signs to each other, no match of the contents among the storing elements in each of the storing element blocks 60(1) to 60(D) and the stored content is constantly updated. Hence, the operating state of all the storing elements is similar to that of the path memory arrangement shown in FIG. 18, so that the power consumption in this case is made maximum. On the other hand, by inputting an ideal receiving signal sequence with no noise following the random transmitting code sequence $\{X(n)\}$, that is, inputting the receiving signal expected value sequence $\{E(n)\}$ itself as the receiving signal sequence $\{Y(n)\}$, as mentioned above, the convergence of the survivor paths is made quite high, so that the convergence is constantly completed. In this case, the average convergence length is several times as small as the path memory length D. In proportion to the average convergence length, the operation probability of each storing element in the path memory is made lower and the power consumption is made lower accordingly.

On the other hand, the possible path memory arrangements shown in FIG. 18 allow all the storing elements to be constantly operated without depending on the pattern of the inputted receiving signal sequence $\{Y(n)\}$. This case, hence, may consume a constant electric power that is substantially same as the input of the receiving signal of the continuous 0s (no signal input state).

As described above, the path memories 42A to 42C of the Viterbi decoder according to an embodiment of the invention are characterized in that the power consumption is greatly changed depending on the pattern of the inputted receiving signal sequence $\{Y(n)\}$. For the change of the power consumption, it is possible to quantitatively cope with this change of the power consumption by inputting an intentional receiving signal pattern from the external and estimating a ratio of an average convergence length to a path memory length D for this pattern in advance. By this fact and by measuring the obvious difference of the path memory power consumption between the case that the no receiving signal input is continuously given and the case that a noiseless receiving signal input is continuously given, this embodiment of the invention may be checked from the outside. In the circuit portion (branch metric operating unit 40, a path metric comparing and selecting unit 41) except the path memory in the Viterbi decoder, the constant processing operations such as the foregoing (1) and (2) are constantly repeated for each input of the receiving signal sequence $\{Y(n)\}$. Hence, the electric power consumed by these circuit portions may be considered to be constant independently of the input signal. The difference of the power consumption of the path memory circuit portion resulting from the difference of the receiving signal pattern input is reflected on the Viterbi decoder as the difference of the overall power consumption. Therefore, the check of this embodiment done by the evaluating the power consumption may be executed for only the path memory circuit portion as well as for the Viterbi decoder. This evaluation is made possible by measuring the power system from the external. To obviate this evaluation, it is possible to constantly input each of the no receiving signal and the noiseless receiving signal to the Viterbi decoding circuit so that the Viterbi decoding circuit may be continuously in operation and to measure the integrating power consumption in each input. In the former case, the difference of the integral power between both inputs is made wider with the measuring time than the latter case, so that the integrating power consumption of the former is made larger than any other case.

The output of the decoding reliability flag 74 may be checked by the similar method to the above. That is, the sequence in which the survivor paths are not converged and the sequence in which the convergence is completed may be separately and intentionally inputted to the Viterbi decoder as its receiving signal sequence {Y(n)}. Further, the no receiving signal input and the noiseless receiving signal input are constantly applied into the Viterbi decoder for keeping the Viterbi decoding circuit in operation, in which state the difference of the flag output between the former input and the latter input is checked.

Next, the description will be oriented to the application of each embodiment of the decoding circuit into the information processing apparatus.

Figure 5:
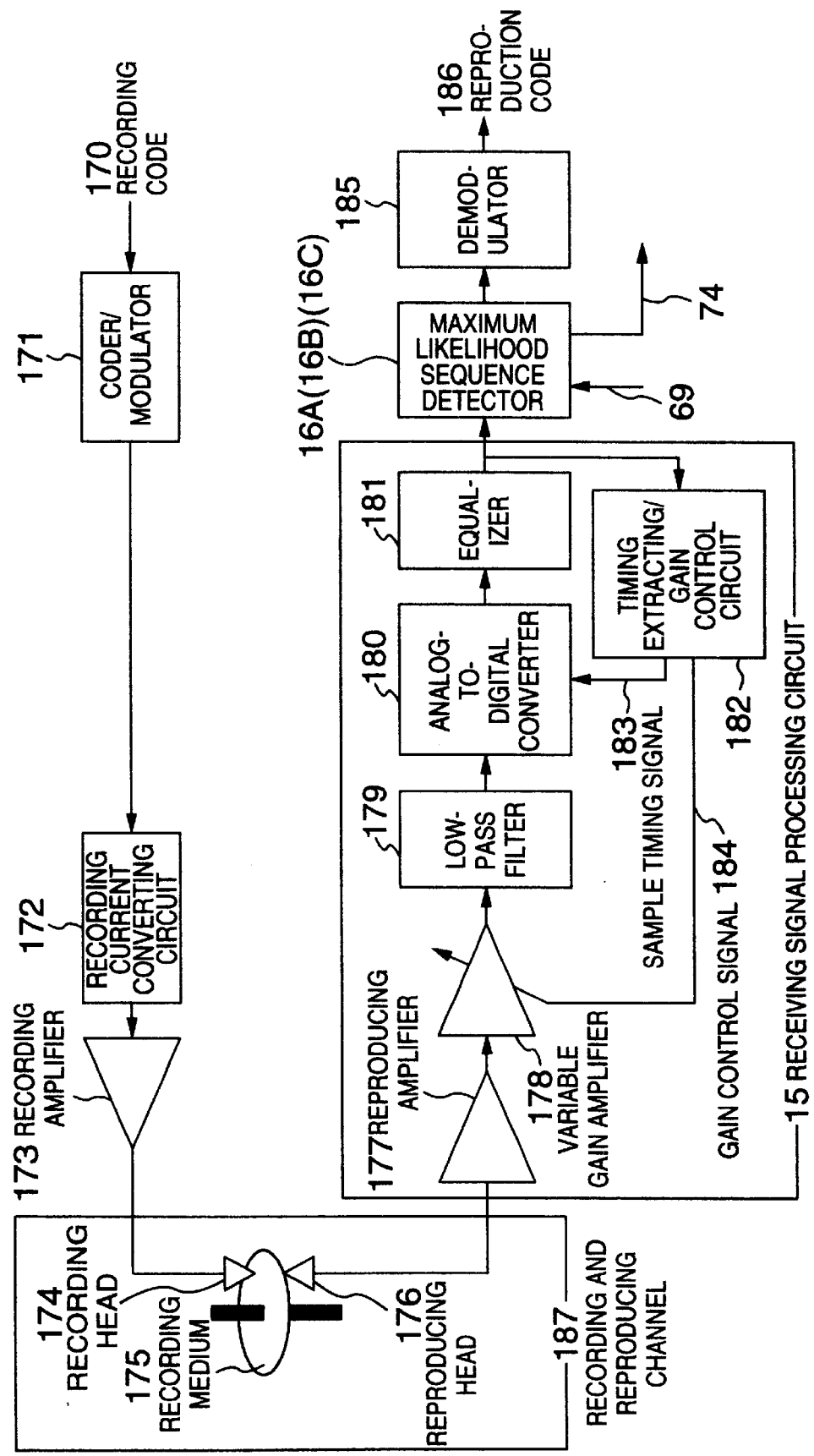
FIG. 5 is a block diagram showing an arrangement of the decoding circuit of the invention incorporated as the maximum likelihood sequence detector into a reproduction signal processing system included in an information storing and reproducing apparatus corresponding to an example of an information processing apparatus according to the invention.

FIG. 5 is a block diagram showing the incorporation of the decoding circuit of the present invention in the reproduction signal processing system of the information storing and reproducing apparatus corresponding to one example of the information processing apparatus, the decoding circuit served as the maximum likelihood sequence detector.

The recording code 170 is subject to the processing of adding redundancy such as error-correcting coding and convolution coding through a coder/modulator 171, signal-modulated according to the type of the recording medium, and then output to a recording and reproducing channel 187 through a recording current converting circuit 172 and a recording amplifier 173. The recording and reproducing channel 187 is composed of a recording head 174, a recording medium 175 on which information is written by the recording head 174, and a reproducing head 176 for reading information out of the recording medium 175. The recording code 170 is written in the recording medium 175 through the recording head 174.

The reproducing head 176 is connected to a receiving signal processing circuit 15, a maximum likelihood sequence detector 16A (path memory 42A) containing a decoding circuit according to an embodiment of the invention, a maximum likelihood sequence detector 16B (path memory 42B), a maximum likelihood sequence detector 16C (path memory 42C), these three of which are representatively abbreviated as 16A, and a demodulator 185.

The receiving signal processing circuit 15 is composed of a reproducing amplifier 177, a variable gain amplifier 178, a low-pass filter 179, an analog-to-digital converter 180, a waveform equalizer 181 for equalizing a waveform of a reproduced signal, and a timing extracting/gain control circuit 182 for generating a sample timing signal 183 and a gain control signal 184 from an output of the waveform equalizer 181 and applying the signals 183 and 184 into the analog-to-digital converter 180 and the variable gain amplifier 178.

The reproduced signal obtained from the recording medium 175 through the reproducing head 176 is subject to suppressing of a variable amplitude, analog-to-digital conversion, waveform equalizing and so forth through the effect of the receiving signal processing circuit 15. Then, the processed signal is applied to the maximum likelihood sequence detector 16A as the decoding input signal sequence Y(n). Then, the processed signal is decoded by the maximum likelihood decoding process based on the Viterbi algorithm by using the path memory of the low power consumption according to the invention illustrated in FIGS. 1 to 3. Then, the decoding signal is demodulated by the demodulator 185 and then is applied as the reproduction code 186 into a processing device (not shown) located at a later stage.

As illustrated in FIG. 5, the information recording and reproducing apparatus provided with the signal processing system containing the maximum likelihood sequence detector 16A of the present invention provides a capability of reducing the power consumption of the path memory circuit, which makes great contribution to realizing a small-sized, high recording density and highly reliable information recording and reproducing apparatus. Further, if the maximum likelihood sequence detector 16B is used, the decoding reliability flag 74 outputted from this maximum likelihood sequence detector 16B is referenced by an upper controller for enabling various control operations such as improvement of a correcting capability by correcting an erasure bit in the error correction of the reproduced data, re-reading (retry) of the reproduced signal from the recording medium 175, early detection of an abnormal state in a system such as a medium, which can make contribution to improving reliability and performance of the data.

Figure 7:
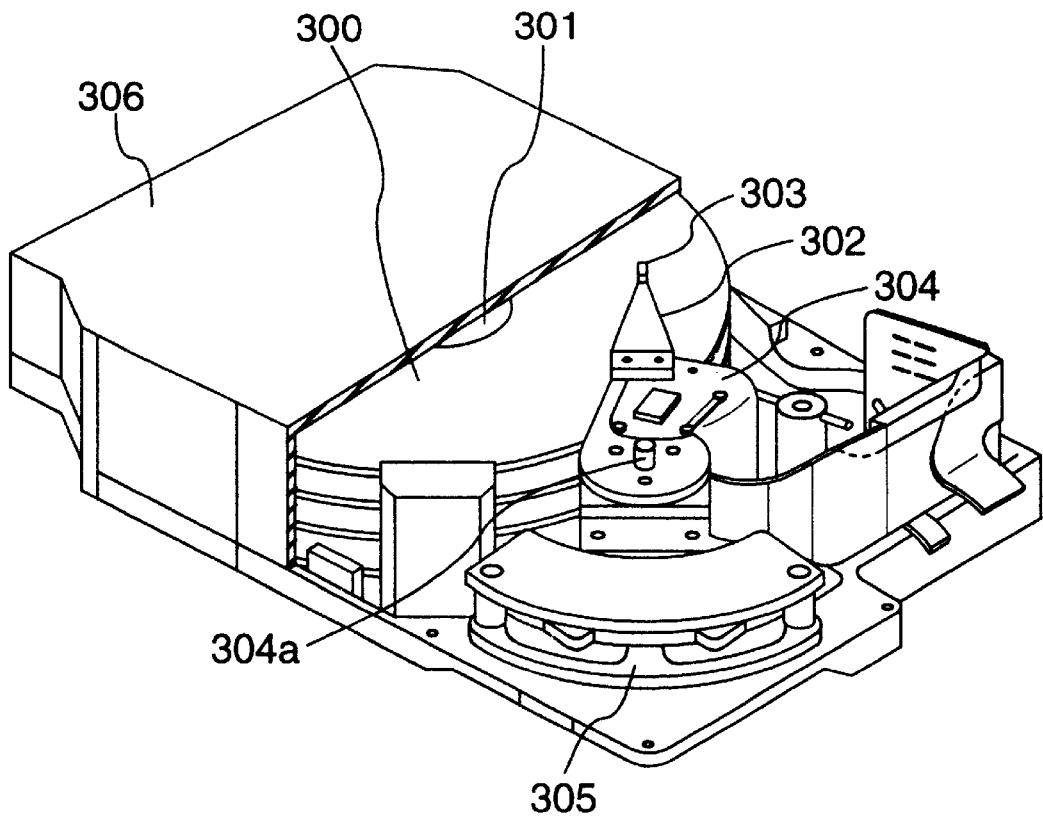
FIG. 7 is a partially broken perspective view showing an exemplary arrangement of a magnetic disk device corresponding to an example of an information processing apparatus according to the invention.

On the other hand, as an example of the information recording and reproducing apparatus containing the signal processing system illustrated in FIG. 5, the magnetic disk device illustrated in FIG. 7 may be considered. This magnetic disk device contains plural magnetic disks 300 axially secured to a common spindle 301 at given intervals and in parallel. Each of the recording planes of each magnetic disk 300 contains plural heads 303 individually held at the tip of a load arm 302. The base end of the load arm 302 is supported by an actuator 304 shaking with a pivot shaft 304a as a center. The actuator 304 is further driven by a voice coil motor 305. The overall structure is accommodated inside of a closed house 306.

That is, by controlling the direction and the amount of current passing through the voice coil motor 305, the actuator 304 and the load arm 302 operate to shake their plane located in parallel to the magnetic disk 300 at a controlled shaking speed and angle. This shaking operation makes a head 303 supported at the tip of the load arm 302 move in the radial direction of the magnetic disk 300 on the recording plane of the magnetic disk 300. Concretely, this shaking operation makes the head 303 move (seek-move) between plural tracks located concentrically on the recording plane of the magnetic disk 300 or follow a specific track.

In the arrangement shown in FIG. 7, the magnetic head 300 corresponds to the recording medium 175 shown in FIG. 5. The head 303 corresponds to the recording head 174 and the reproducing head 176 and composes the recording and reproducing channel 187. The control circuit containing a signal processing system illustrated in FIG. 5 is mounted on a control substrate (not shown) located on the bottom of the closed house 306, for example.

The magnetic disk device is an important component as a secondary storage device of a portable information terminal, which is severely requested in the market to be reduced in size and enlarged in volume (recording density). In order to meet with the request, the magnetic disk device is designed to improve the head 303 and the recording density by narrowing the track interval in the magnetic disk 300. It is essential to improve the error correction and decoding capability in the signal processing system of the recording/reproduction signal together with the improvement of the recording density.

By employing the maximum likelihood sequence detector 16A (the maximum likelihood sequence detector 16B and the maximum likelihood sequence detector 16C) containing the decoding circuit according to each embodiment of the invention in the signal processing system of this kind of magnetic disk device, the resulting maximum likelihood decoding process lowers its power consumption, makes the reduction of the decoding device in size by integration easier, and enhances the performance. Hence, this process makes contribution to enhancing the recording density and the volume, reducing the device in size, and making the performance higher and more reliable.

In the case of employing the maximum likelihood sequence detector 16B containing the path memory 42B, by referring to the decoding reliability flag 74 outputted from the decoding reliability flag output circuit 75, it is possible to execute various kinds of controls and operations such as improvements of an error-correcting performance and reliability in recording and reproducing information and detection of an error of a device at an early stage.

Figure 8:
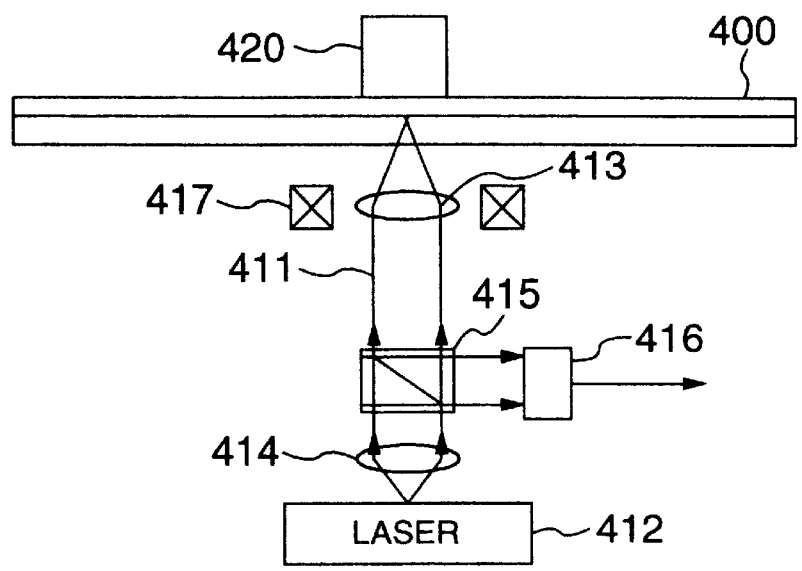
FIG. 8 is a conceptual view showing an exemplary arrangement of an optical disk unit or a magneto-optical disk device corresponding to an example of an information processing apparatus according to the invention.

Next, the description will be oriented to the application of the signal processing system of the invention to an optical disk device or a magneto-optical disk device illustrated in FIG. 8 as another example of the information storing and reproducing apparatus having the signal processing system of the present invention illustrated in FIG. 5. For the optical disk device, the application of the Viterbi decoding has been widely studied for enhancing the recording density and reliability.

The optical disk device is arranged to have an optical disk 400 composed of a recording film and a substrate and served as a recording medium and an optical head 410 for recording and reproducing information on and from the optical disk 400.

The optical head 410 is arranged to have a semiconductor laser 412 for generating a laser beam 411 and applying the beam 411 onto the optical disk 400, lenses 413 and 414 for converging the laser beam 414 and guiding the converged beam onto the optical disk 400, a beam splitter 415 for branching the laser beam 411 reflected on the optical disk 400 and guiding the branched beam into a light detector 416, and an actuator 417 for controlling a focal point of the laser beam to be applied onto the optical disk 400.

For the magneto-optical disk device for recording, reproducing and erasing information through the use of a magnetic field applied from the external, if necessary, an external magnetic field generator 420 is provided for changing the direction of the magnetic field. With the change of the direction of the magnetic field, the laser beam 411 under the control of a recording/erasing power is applied onto the magneto-optical disk for doing the recording, reproducing and erasing operations.

In the case of applying the signal processing system of the invention illustrated in FIG. 5 into the optical disk device arranged as described above, the optical disk 400 and the optical head 410 correspond to the recording and reproducing channel 187 shown in FIG. 5. The recording amplifier 73 shown in FIG. 5 is connected to the semiconductor laser 412 so that the amplifier 73 may control an output of the laser 412 for recording information. The reproducing amplifier 177 shown in FIG. 5 is connected to the light detector 416 so that the light detector 416 may detect a level change of the reflected light of the laser beam 411 from the optical disk 400 for reproducing information.

Also in the optical disk device or the magneto-optical disk device, in the case of employing the maximum likelihood sequence detector 16A (the maximum likelihood sequence detectors 16B and 16C) containing the decoding circuit according to each embodiment of the invention in the signal processing system of the reproducing side, the resulting maximum decoding process does not need so great power consumption, makes the device easily reduced in size by integration, and enhances the performance. This makes great contribution to allowing the optical disk device or the magneto-optical disk device to enhance the recording density and the volume, reduce in size and keep the performance and the reliability higher. Further, in the case of employing the maximum likelihood sequence detector 16B containing the path memory 42B, by referring to the decoding reliability flag 74 outputted from the decoding reliability flag output circuit 75, it is possible to execute various kinds of controls and operations such as improvements of error-correcting performance and reliability in recording and reproducing information and detection of an error of a medium or a device at an early stage.

Figure 6:
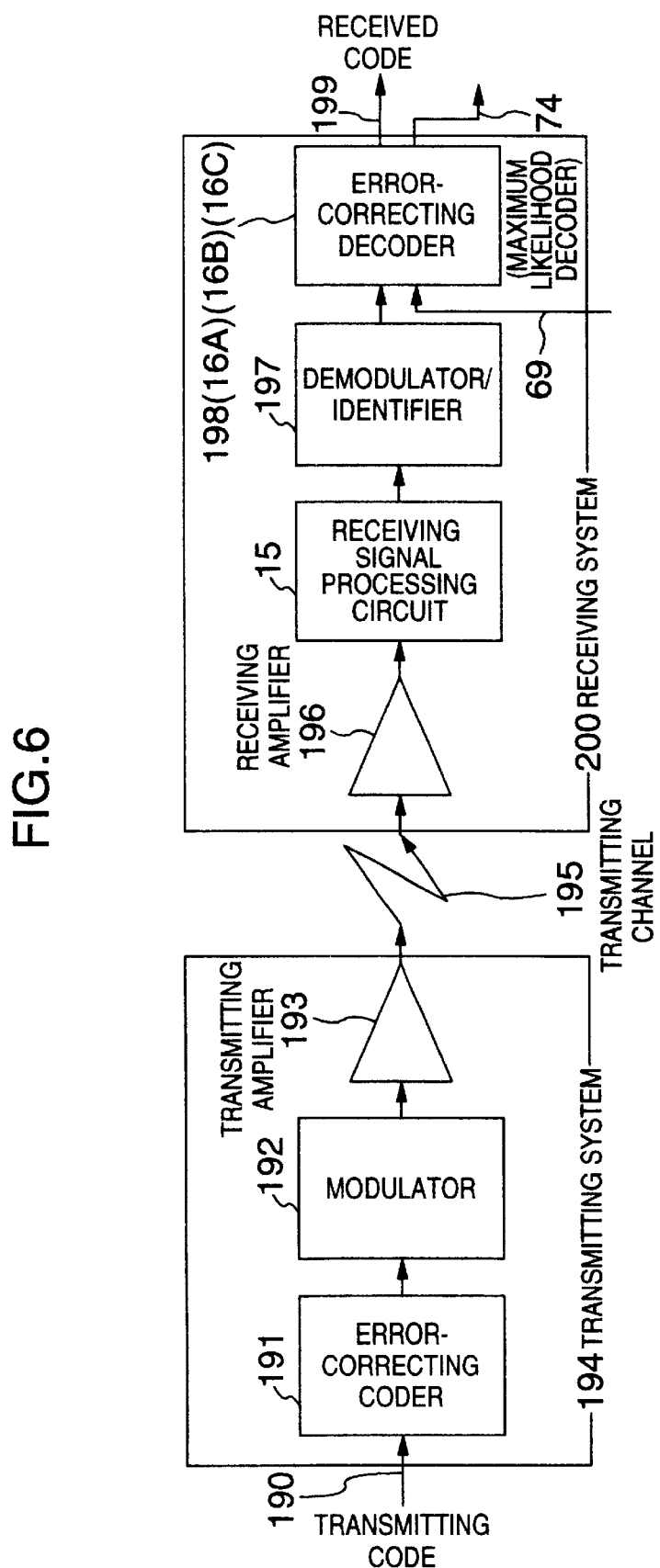
FIG. 6 is a block diagram showing an arrangement of the decoding circuit of the invention incorporated as an error-correcting decoder into a receiving system of an information transmitting and communicating device such as a modem corresponding to an example of an information processing apparatus according to the invention.

FIG. 6 is a block diagram exemplarily showing incorporation of the decoding circuit of the invention as an error-correcting decoder into a receiving system of an information transmitting and communicating device such as a modem, which corresponds to an example of an information processing device.

A transmitting system denoted by 194 is connected to a receiving system denoted by 200 through a transmission channel 195 composed of any communication medium. The transmitting system 194 includes an error-correcting coder 191, a modulator 192, a transmitting amplifier 193, and so forth. The receiving system 200 includes a receiving amplifier 196, a receiving signal processing circuit 15, a demodulator/identifier 197, and an error-correcting decoder 198 (maximum likelihood sequence detectors 16A, 16B and 16C) to which the decoding technique of the invention is applied.

A transmitting code 190 to be inputted into the transmitting system 194 is passed through the error-correcting coder 191 in which the transmitting code 190 is subject to the processing such as convolutional coding for making the code 190 redundant. Then, the processed code is subject to a given modulating process according to a type of the transmitting channel 195. Next, the modulated signal is amplified by the transmitting amplifier 193 and then is sent out to the transmitting channel 195.

In the receiving system 200, on the other hand, the receiving signal coming through the transmitting channel 195 is amplified by the receiving amplifier 196. The amplified signal is sent to the same receiving signal processing circuit 15 as shown in FIG. 5, in which circuit 15 the suppression of an amplitude variation, the analog-to-digital conversion, and the waveform equalization are carried out with respect to the amplified signal. Then, the processed signal is sent to the demodulator/identifier 197 in which it is converted into a decoding input signal sequence. The signal sequence is applied into the error-correcting decoder 198 located at a later stage in which the maximum likelihood decoding process is done with respect to the signal. The resulting signal is outputted as the received code 199.

For example, in the case of applying this error-correcting decoder 198 to a modem to be built into a portable information terminal or a portable communication terminal, the lower power consumption realized for the error-correcting decoder 198 of the present invention makes it possible to lower the power consumption of the portable information terminal or the portable communication terminal, thereby advantageously keeping the terminal working for a longer time or increase the volume of the path memory without lowering the power consumption, thereby advantageously improving the error-correcting capability or decoding precision.

The features rather than those described in the scope of claims of the present application may be enumerated as follows.

(1) In a survivor path sequence storing circuit of a decoding circuit for estimating a maximum likelihood sequence, the survivor path sequence storing circuit has the following features of (a), (b) and (c).

(a) The survivor path sequence storing circuit includes D storing circuit blocks (D is a given integer), each of the D storing circuit blocks characterized to have as components N selecting circuits (or selecting elements) for being inputted with N (N is a given integer) survivor path sequence selecting signals composed of a given number of signal lines from a path metric operating and comparing circuit at each operating unit time of a decoding process and for selectively outputting one of signals at plural input terminals with each of the survivor path sequence selecting signals as a selection indicating input signal and N or more storing circuits (or storing elements) for being inputted with each of the selecting output signal from the selecting circuits or each of the signals at individual input terminals at each operating unit time, the output signal of a stored content from the storing circuits (or storing elements) being connected to a given input terminal, and the stored content selected by the storing circuit (or storing element) being made to be the stored content of the given storing circuit (or storing element) again at each operating unit time, (b) A starting signal generating circuit is provided for generating a starting signal at each operating unit time and feeding the starting signal to any one of the D storing circuit blocks sequentially and cyclically in a fixed sequence so that the starting signal is inevitably fed to any one of the storing circuit blocks at each operating unit time during the operating period of the decoding process and the starting signal is periodically fed to the storing circuit block being inputted with the output of the starting signal at given operating unit time intervals, and (c) In the (b), the storing circuit block being inputted with the starting signal has a function of outputting the stored content of the given ones of the storing circuits (or the storing elements) composing the storing circuit block as the decoded result and at once setting all the stored contents of the storing circuits (or storing elements) to a given initial value.

(2) In the survivor path sequence storing circuit described in (1), the survivor path sequence storing circuit is characterized to have a coincidence detecting circuit (or coincidence detecting element) for referring to the stored contents of the given number of storing circuits (or storing elements) in the storing circuit block for detecting if the stored contents are coincident with each other and have a function of breaking a supply of a synchronous clock signal to part or all of the storing circuits (or storing elements) composing the storing circuit block or stopping an operation of updating the stored content at each operating unit time in response to an output indicating the coincidence of the stored content from the coincidence detecting circuit (or coincidence detecting element).

(3) In the survivor path sequence storing circuit described in (1), the survivor path sequence storing circuit is characterized to have a coincidence detecting circuit (or coincidence detecting element) for referring to the stored contents of the given number of storing circuits (or storing elements) in the storing circuit block for detecting if the stored contents are coincident with each other and have a function of outputting the output signal of the coincidence detecting circuit (or coincidence detecting element) together with the decoded result in response to the starting signal fed to the storing circuit block.

(4) In a survivor path sequence storing circuit of a decoding circuit for estimating a maximum likelihood sequence through the use of the Viterbi algorithm, the survivor path sequence storing circuit has the following features of (a), (b), (c) and (d), (a) the survivor path sequence storing circuit including N (N is a given integer) signal delaying circuit (or delaying elements) for being inputted with N survivor path sequence selecting signals composed of a given number of signal lines from a path metric operating and comparing circuit at each operating unit time of the decoding process, holding each content of the survivor path sequence selecting signals over a T operating unit time (T is a given integer of 1 or more), and outputting the held content, (b) the survivor path sequence storing circuit including D (D is a given integer) storing circuits (or storing elements) for storing each piece of survivor path sequence history information and feeding a synchronous clock signal for driving a process of updating the stored content at each operating unit time through the corresponding same clock signal control circuits (or clock signal control elements) and a selecting circuit (or selecting element) for selectively outputting an input signal to the D storing circuits (or storing elements), the selecting circuit for being inputted with plural stored contents outputted from the given number of storing circuits (or storing elements) and selectively outputting one of the stored contents with the survivor path sequence selecting signal outputted from the same signal delaying circuit (or delaying element) as the selection indicating signal, (c) each of the clock signal control circuits (or clock signal control elements) including a deciding circuit (or deciding element) for deciding if the content outputted from the storing circuit (or storing element) to which the synchronous clock signal is supplied from the clock signal control circuit (or clock signal control element) is referred for a decoding time corresponding to the T operating unit time passed since each decoding time point, the clock signal control circuit (or clock signal control element) for being inputted with the determined result from the deciding circuit (or deciding element) and for stopping the supply of a synchronous clock signal for driving the process of updating the stored content for the decoding time point of the storing circuit (or storing element) if the determined result indicates that no reference is given to the storing circuit (or storing element), and (d) the deciding circuit (or deciding element) serving to execute the decision indicated by (c) by referring to a given survivor path sequence selecting signal inputted from the path metric operating and comparing circuit at each decoding time point.

(5) In a decoding circuit for estimating a maximum likelihood sequence through the use of the Viterbi algorithm, a maximum likelihood decoding circuit or a maximum likelihood decoding device is characterized in that an average power consumption or an integrating power consumption of the decoding circuit is changed according to a difference of a decoding input signal sequence inputted to the decoding circuit and an average power consumption or an integrating power consumption given in the case of continuously giving and decoding a zero input signal sequence as the decoding input signal sequence during a given decoding period is larger than an average power consumption or an integrating power consumption given in the case of inputting and decoding any noiseless input signal sequence for meeting a given constraint condition regulated in the decoding input signal sequence.

(6) In a decoding circuit for estimating a maximum likelihood sequence through the use of the Viterbi algorithm by using a survivor path sequence storing circuit for storing a desirous number of decoding input signal sequences, the decoding circuit is a maximum likelihood decoding circuit or a maximum likelihood decoding device including signal output means for indicating respective states in a period of continuously giving as the decoding input signal sequence a zero input signal sequence, decoding it and outputting the decoded sequence during a decoding period and in a period when any noiseless input signal sequence for meeting the given constraint condition regulated in the decoding input signal sequence is given and decoded, and wherein the signal outputted from the signal output means at each decoding time unit is outputted to the outside as a flag signal for indicating if the decoded result outputted from the survivor path sequence storing circuit is reliable, a flag signal for indicating if the decoded result is erroneous, or a flag signal for indicating if the decoded result is given on the solely determined survivor path sequence information in the survivor path sequence storing circuit.

(7) An information storing and reproducing device characterized to mount the survivor path sequence storing circuit indicated in (1) to (4) or the maximum likelihood decoding circuit or device indicated in (5) to (6) on the device itself. (8) An information receiving device or an information communicating and transmitting device characterized to mount the survivor path sequence storing circuit indicated in (1) to (4) or the maximum likelihood decoding circuit or device indicated in (5) to (6) on the device itself.

(9) A signal receiving device or an information processing device characterized to mount the survivor path sequence storing circuit indicated in (1) to (4) or the maximum likelihood decoding circuit or device indicated in (5) to (6) on the circuit itself.

(10) An integrating circuit characterized to mount the survivor path sequence storing circuit indicated in (1) to (4) or the maximum likelihood decoding circuit or device indicated in (5) to (6) on the circuit itself.

The foregoing description has been expanded along the embodiments of the present invention invented by the inventor of the present application. It goes without saying that the present invention is not limited by the foregoing embodiments and may be modified in various forms without departing from the spirit of the invention.

For example, the information processing device is not limited to the magnetic disk device, the optical disk device, the magneto-optical disk device or the modem but may be widely applied to the information processing device provided with a signal processing system involving the maximum likelihood decoding operation.

The decoding device of the invention may offer the effect of reducing the power consumption of a relatively large-scaled survivor path sequence storing circuit (path memory) in the maximum likelihood decoding circuit or device.

The decoding device of the present invention may offer the effect of allowing the decoding device itself to be mounted on a relatively small-sized information processing instrument that is requested to consume a low electric power so that the highly reliable maximum likelihood decoding may be realized.

The decoding device of the present invention may offer the effect of controlling and operating the instrument on which the decoding device itself is to be mounted in various manners.

The decoding device of the present invention may offer the effect of realizing the flexibility in design and the integrity in packaging when packing the circuit to a semiconductor integrated circuit, for the purpose of improving a yield.

The information processing device of the present invention may offer the effect of reducing the power consumption of a relatively large-scaled survivor path sequence storing circuit (path memory) in the maximum likelihood decoding circuit or device mounted on the information processing device itself, for the purpose of reducing the power consumption of the overall device.

The information processing device of the present invention may offer the effect of easily realizing the highly reliable information processing instrument with the maximum likelihood decoding and at low power consumption.

The information processing device of the present invention may offer the effect of executing various kinds of controls and operations based on the information obtained from the mounted decoding circuit.

The information processing device of the present invention may offer the effect of improving the flexibility in design and the integration in packaging when packaging a circuit to a semiconductor integrated circuit of the decoding circuit with the maximum likelihood decoding operation.

What is claimed is:

1. A decoding circuit for estimating a maximum likelihood sequence through the effect of the Viterbi algorithm, comprising:

a survivor path sequence storing circuit for storing a desired number of decoding input signal sequences; and a plurality of storing means composing said survivor path sequence storing circuit, wherein said plurality of storing means are divided into plural storing circuit blocks, each of said storing circuit blocks having common selection inputs, and each of said storing means within the storing circuit block having a discrete detected output, each said discrete detected output is fed back to at least one of said storing means within the same storing circuit block, and supply of a synchronous clock signal for driving an operation of updating stored contents is temporarily stopped at each operating unit time of said each storing means.

2. A decoding circuit as claimed in claim 1, wherein each of said storing circuit blocks includes an output circuit, and respective outputs from said output circuits of said storing circuit blocks compose an output of said survivor path sequence storing circuit.

* * * * *